(12) United States Patent
Suzuki

(10) Patent No.: US 10,468,281 B2
(45) Date of Patent: Nov. 5, 2019

(54) CONVEYANCE SYSTEM

(71) Applicant: Murata Machinery, Ltd., Kyoto-shi (JP)

(72) Inventor: Takashi Suzuki, Inuyama (JP)

(73) Assignee: Murata Machinery, Ltd., Kyoto (JP)

(*) Notice: Subject to any disclaimer, the term of this patent is extended or adjusted under 35 U.S.C. 154(b) by 0 days.

(21) Appl. No.: 16/080,414

(22) PCT Filed: Jan. 24, 2017

(86) PCT No.: PCT/JP2017/002313
§ 371 (c)(1),
(2) Date: Aug. 28, 2018

(87) PCT Pub. No.: WO2017/150005
PCT Pub. Date: Sep. 8, 2017

(65) Prior Publication Data
US 2019/0019707 A1      Jan. 17, 2019

(30) Foreign Application Priority Data

Mar. 3, 2016   (JP) ................................. 2016-041532

(51) Int. Cl.
*B65G 1/04* (2006.01)
*B65G 1/00* (2006.01)
*H01L 21/677* (2006.01)

(52) U.S. Cl.
CPC ...... *H01L 21/67727* (2013.01); *B65G 1/0464* (2013.01); *H01L 21/6773* (2013.01);
(Continued)

(58) Field of Classification Search
None
See application file for complete search history.

(56) References Cited

U.S. PATENT DOCUMENTS 6,321,138 B1 * 11/2001 Livesay ............... B65G 1/0414
198/346.1
6,654,662 B1 * 11/2003 Hognaland .......... B65G 1/0464
700/214
(Continued)

FOREIGN PATENT DOCUMENTS

JP    11-189313 A    7/1999
JP    11-214471 A    8/1999
(Continued)

*Primary Examiner* — Kavel Singh
(74) *Attorney, Agent, or Firm* — DLA Piper LLP (US)

(57) ABSTRACT

A conveyance system includes a travel rail; and a plurality of vehicles each having a travel part configured to travel on the travel rail in a first direction and a second direction and a transfer part including a holder configured to hold the carrier and an elevator configured to elevate and lower the holder, in which the travel rail is disposed such that each of the vehicles is accessible to a first stop position in which the transfer part is arranged immediately above each of the transfer ports of a first processing device group performing processing of a certain process and such that the vehicle is accessible to a second stop position in which the transfer part is arranged immediately above each of the transfer ports of a second processing device group performing processing of a process different from the certain process from the first stop position.

7 Claims, 18 Drawing Sheets

(52) U.S. Cl.
CPC .. *H01L 21/67724* (2013.01); *H01L 21/67733* (2013.01); *H01L 21/67736* (2013.01); *B65G 2201/0297* (2013.01)

(56) References Cited

U.S. PATENT DOCUMENTS

| | | | |
|---|---|---|---|
| 8,701,864 B2 * | 4/2014 | Ogawa | B65G 35/06 104/91 |
| 9,004,840 B2 * | 4/2015 | Kinugawa | H01L 21/67733 414/281 |
| 9,061,839 B2 * | 6/2015 | Murayama | H01L 21/67715 |
| 2012/0275886 A1 | 11/2012 | Ota | |

FOREIGN PATENT DOCUMENTS

| | | |
|---|---|---|
| JP | 2007-017326 A | 1/2007 |
| JP | 2009-057117 A | 3/2009 |
| JP | 2012-111635 A | 6/2012 |
| WO | 2014/203126 A1 | 12/2014 |
| WO | 2015/019055 A1 | 2/2015 |
| WO | 2015/174181 A1 | 11/2015 |
| WO | 2016/039023 A1 | 3/2016 |

\* cited by examiner

CONVEYANCE SYSTEM

TECHNICAL FIELD

This disclosure relates to a conveyance system.

BACKGROUND

A system described in Japanese Unexamined Patent Publication No. 2012-111635 is known as a conventional conveyance storage system. The transport system described in JP '635 includes: a first track that passes above loading ports of processing devices; an overhead traveling vehicle traveling along the first track and including a hoist; a second track under and in parallel or substantially parallel to the first track, the second track passing above the load ports; a buffer for placement of the carrier, the buffer being provided under the second track at a position higher than the loading port, and being arranged to allow the carrier pass in a vertical direction over the loading port; and a local vehicle traveling along the second track and including a hoist to perform delivery and receipt of the carrier between the buffer and the loading port.

It is a conventional technique that the first track is provided between processes and that the carrier is conveyed between the processes by the ceiling traveling vehicle. However, the travel path that the ceiling traveling vehicle can take is limited in the track; another ceiling traveling vehicle blocks the travel path, for example, to hinder the travel of the ceiling conveyance vehicle behind, which may reduce inter-process conveyance efficiency.

It could therefore be helpful to provide a conveyance system that can improve inter-process carrier conveyance efficiency.

SUMMARY

I provide a conveyance system conveying a carrier housing a substrate between transfer ports provided respectively to a plurality of processing devices performing processing on the substrate, the conveyance system including a travel rail having a plurality of first rails extending linearly in a first direction and a plurality of second rails extending in a second direction orthogonal to the first direction, the first rails and the second rails being disposed in a grid pattern on a same plane; and a plurality of vehicles each having a travel part configured to travel on the travel rail in the first direction and the second direction and a transfer part including a holder configured to hold the carrier and an elevator configured to elevate and lower the holder, wherein the travel rail is disposed such that each of the vehicles is accessible to a first stop position in which the transfer part is arranged immediately above each of the transfer ports of a first processing device group performing processing of a certain process and such that the vehicle is accessible to a second stop position in which the transfer part is arranged immediately above each of the transfer ports of a second processing device group performing processing of a process different from the certain process from the first stop position.

I also provide the conveyance system wherein the plurality of transfer ports are arranged adjacent to each other in the first direction or the second direction in each of the first processing device group and the second processing device group, and the travel rail is disposed such that the vehicle is accessible to the second stop position from the first stop position in which the transfer part is positioned immediately above the transfer ports provided in arrangement directions parallel to each other in the first processing device group and the second processing device group.

I also provide the conveyance system, wherein the travel rail is disposed such that the vehicle is accessible to the second stop position from the first stop position in which the transfer part is arranged immediately above the transfer ports arranged opposite each other in the first processing device group and the second processing device group.

I also provide the conveyance system, including the plurality of first processing device groups and the plurality of second processing device groups provided such that the transfer ports are provided in arrangement directions parallel to each other, wherein the travel rail is disposed such that the vehicle is accessible to the first stop position in which the transfer part is arranged immediately above the transfer ports of one of the first processing device groups and the second processing device groups and such that the vehicle is accessible to the second stop position in which the transfer part is arranged immediately above the transfer ports of another of the first processing device groups and the second processing device groups from the first stop position.

I also provide the conveyance system, wherein each of the first processing device groups and the second processing device groups has the plurality of transfer ports arranged in the first direction and the plurality of transfer ports arranged in the second direction, in each of the first processing device groups and the second processing device groups, the transfer ports arranged in the first direction or the second direction include ones not arranged on a same straight line but disposed at positions shifted in the first direction or the second direction, and the travel rail is disposed such that the vehicle is accessible to the first stop position in which the transfer part is arranged immediately above each of the transfer ports of the first processing device group and such that the vehicle is accessible to the second stop position in which the transfer part is arranged immediately above each of the transfer ports of the second processing device group from the first stop position.

I also provide the conveyance system, wherein the vehicle travels on the travel rail with the transfer part positioned above the travel rail, the travel rail has an opening in a region covering the transfer port in a two-dimensional view, and the vehicle transfers the carrier to the transfer port using the transfer part through the opening.

I also provide the conveyance system, including a storage configured to store the carrier wherein the travel rail is disposed such that the vehicle is accessible to a stop position in which the transfer part is arranged immediately above the storage.

I also provide the conveyance system, wherein the first rails and the second rails of the travel rail are respectively disposed with spacing to enable the carrier to pass through in a vertical direction, the storage is disposed immediately below a space defined by the first rail and the second rail, and the vehicle transfers the carrier to the storage using the transfer part through the space.

I also provide the conveyance system, wherein the opening has a region covering a plurality of the transfer ports provided at one of the processing devices.

I also provide the conveyance system, wherein the transfer part has a movable part configured to advance the retract the elevator in a direction parallel to a plane along the first direction and the second direction, and the vehicle stops on at least one of the first rail and the second rail forming the opening and advances the movable part to transfer the carrier to the transfer port through the opening.

I also provide the conveyance system, wherein the travel rail is disposed such that the vehicle is stoppable immediately above the transfer port, and the vehicle stops immediately above the transfer port and transfers the carrier to the transfer port through the opening.

I also provide the conveyance system, wherein the vehicle travels on the travel rail with the transfer part positioned below the travel rail.

I also provide the conveyance system, wherein the travel rail is provided with a detection target at a stop position of the vehicle for the transfer port, the vehicle includes a detector configured to detect the detection target, and the travel part stops the vehicle at the stop position, based on a result of detection by the detector.

Inter-process carrier conveyance efficiency can thus be improved.

REFERENCE SIGNS LIST

Figure 1:
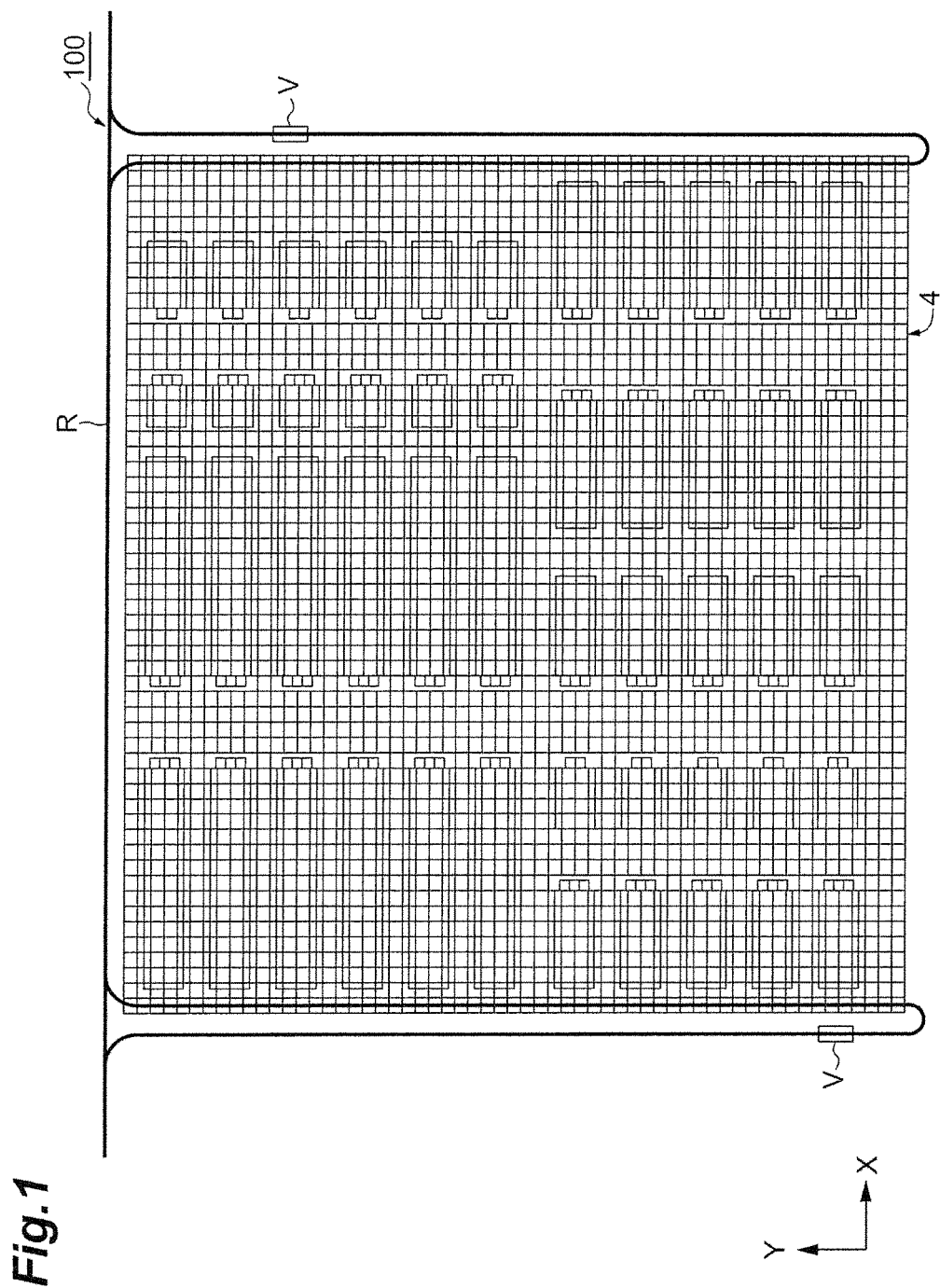
FIG. 1 is a plan view of a conveyance system according to an example.

4 . . . travel rail, 6 . . . buffer, 8 . . . vehicle, 9 . . . first rail, 11 . . . second rail, 22 . . . cell buffer (storage), 24 . . . travel part, 26 . . . transfer part, 38 . . . barcode reader (detector), 45 . . . elevating device (elevator), 46A . . . gripper (holder), 50 . . . FOUP (carrier), 100 . . . conveyance system, b barcode (detection target), p1 to p9 . . . first to ninth load ports.

DETAILED DESCRIPTION

My conveyance system conveys a carrier housing a substrate between transfer ports provided respectively to a plurality of processing devices performing processing on the substrate. The conveyance system includes: a travel rail having a plurality of first rails extending linearly in a first direction and a plurality of second rails extending in a second direction orthogonal to the first direction, the first rails and the second rails being disposed in a grid pattern on a same plane; and a plurality of vehicles each having a travel part configured to travel on the travel rail in the first direction and the second direction and a transfer part including a holder configured to hold the carrier and an elevator configured to elevate and lower the holder, in which the travel rail is disposed such that each of the vehicles is accessible to a first stop position in which the transfer part is arranged immediately above each of the transfer ports of a first processing device group performing processing of a certain process and such that the vehicle is accessible to a second stop position in which the transfer part is arranged immediately above each of the transfer ports of a second processing device group performing processing of a process different from the certain process from the first stop position.

The travel rail may be disposed such that the vehicle is accessible to the stop position in which the transfer part is arranged immediately above each of the transfer ports of the first processing device group performing the processing of the certain process and such that the vehicle is accessible to the stop position in which the transfer part is arranged immediately above each of the transfer ports of the second processing device group performing the processing of the process different from the certain process. With this configuration, the conveyance system, when conveying the carrier by the vehicle between the transfer port of the first processing device group and the transfer port of the second processing device group, can take a plurality of travel paths by a combination of the first direction and the second direction and can thus convey the carrier by selecting a travel path to overtake another vehicle in the travel direction ahead stopping to perform a transfer operation. Consequently, the conveyance system can improve inter-process carrier conveyance efficiency.

The plurality of transfer ports may be arranged adjacent to each other in the first direction or the second direction in each of the first processing device group and the second processing device group, and the travel rail may be disposed such that the vehicle is accessible to the second stop position from the first stop position in which the transfer part is positioned immediately above the transfer ports provided in arrangement directions parallel to each other in the first processing device group and the second processing device group. With this configuration, the efficiency of conveying the carrier between the first processing device group and the second processing device group can be improved.

The travel rail may be disposed such that the vehicle is accessible to the second stop position from the first stop position in which the transfer part is arranged immediately above the transfer ports arranged opposite each other in the first processing device group and the second processing device group. With this configuration, the efficiency of conveying the carrier between the first processing device group and the second processing device group can be further improved.

The conveyance system may include the plurality of first processing device groups and the plurality of second processing device groups provided such that the transfer ports are provided in arrangement directions parallel to each other, and the travel rail may be disposed such that the vehicle is accessible to the first stop position in which the transfer part is arranged immediately above the transfer ports of one of the first processing device groups and the second processing device groups and such that the vehicle is accessible to the second stop position in which the transfer part is arranged immediately above the transfer ports of another of the first processing device groups and the second processing device groups from the first stop position. With this configuration, the efficiency of conveying the carrier between groups including the first processing device group and the second processing device group can be further improved.

Each of the first processing device groups and the second processing device groups may have the plurality of transfer ports arranged in the first direction and the plurality of transfer ports arranged in the second direction, in each of the first processing device groups and the second processing device groups, the transfer ports arranged in the first direction or the second direction may include ones not arranged on a same straight line but disposed at positions shifted in the first direction or the second direction, and the travel rail may be disposed such that the vehicle is accessible to the first stop position in which the transfer part is arranged immediately above each of the transfer ports of the first processing device group and such that the vehicle is accessible to the second stop position in which the transfer part is arranged immediately above each of the transfer ports of the second processing device group from the first stop position. With this configuration, the degree of freedom of the arrangement of the transfer ports, and thus, the degree of freedom of the arrangement of the processing devices can be increased.

The vehicle may travel on the travel rail with the transfer part positioned above the travel rail, the travel rail may have an opening in a region covering the transfer port in a two-dimensional view, and the vehicle may transfer the carrier to the transfer port using the transfer part through the opening. With this configuration, in the configuration of the vehicle traveling on the travel rail with the transfer part positioned above the travel rail, the vehicle can transfer the carrier to the transfer port even when the travel rail is provided to surround the transfer port in a two-dimensional view.

The conveyance system may include a storage configured to store the carrier, and the travel rail may be disposed such that the vehicle is accessible to a stop position in which the transfer part is arranged immediately above the storage. With this configuration, the carrier can be temporarily stored at a position in which the carrier can be conveyed to the transfer port by the vehicle traveling the travel rail.

The first rails and the second rails of the travel rail may be respectively disposed with spacing to enable the carrier to pass through in a vertical direction, the storage may be disposed immediately below a space defined by the first rail and the second rail, and the vehicle may transfer the carrier to the storage using the transfer part through the space. In this configuration, in the configuration of the vehicle traveling on the travel rail with the transfer part positioned above the travel rail, many carriers can be stored at a position that does not obstruct traveling of the vehicle.

The opening may have a region covering a plurality of the transfer ports provided at one of the processing devices. This configuration ensures the degree of freedom of relative position between the travel rail and the transfer port in a two-dimensional view.

The transfer part may have a movable part configured to advance and retract the elevator in a direction parallel to a plane along the first direction and the second direction, and the vehicle may stop on at least one of the first rail and the second rail forming the opening and advance the movable part to transfer the carrier to the transfer port through the opening. In this configuration, the region of the opening can be increased. Accordingly, the degree of freedom of relative position between the travel rail and the transfer port in a two-dimensional view can be ensured.

The travel rail may be disposed such that the vehicle is stoppable immediately above the transfer port, and the vehicle may stop immediately above the transfer port and transfer the carrier to the transfer port through the opening. In this configuration, the carrier can be transferred quickly to the transfer port.

The vehicle may travel on the travel rail with the transfer part positioned below the travel rail. In this configuration, the carrier can be transferred to the transfer port without providing an opening in the travel rail.

The travel rail may be provided with a detection target at a stop position of the vehicle for the transfer port, the vehicle may include a detector configured to detect the detection target, and the travel part may stop the vehicle at the stop position, based on a result of detection by the detector. In this configuration, the vehicle can stop accurately at the stop position for the transfer port.

Preferred examples of my conveyance system will be described in detail below with reference to the accompanying drawings. In the description of the drawings, the same or corresponding elements will be denoted by the same reference signs and an overlapping description will be omitted.

A conveyance system 100 illustrated in FIG. 1 is, for example, a system that conveys a cassette accommodating substrates such as a plurality of semiconductor wafers in a clean room of a semiconductor fab equipped with a plurality of processing devices. The cassette is a carrier (article) intended for conveyance and storage of semiconductor wafers, and examples thereof include front opening unified pod (FOUP), front opening shipping box (FOSB), and SMIFPod. In this example, a conveyance system that conveys a FOUP 50 will be described by way of example. The FOUP 50 includes a body 51, a lid 52 attached to the opening of the body 51, and a flange 53 provided at the top of the body 51. The conveyance system 100 also has the function as a temporary storage system to temporarily store the FOUP 50.

Figure 2:
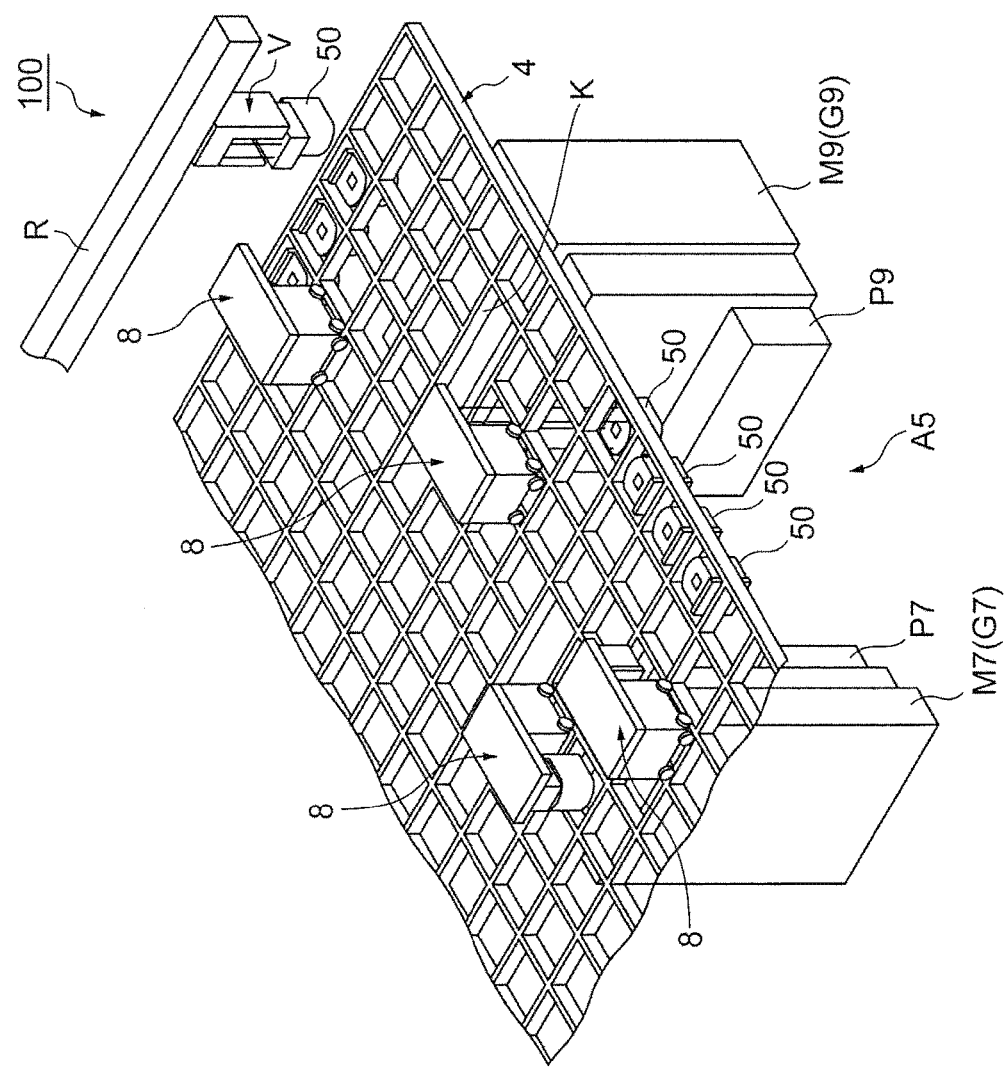
FIG. 2 is a perspective view of part of the conveyance system illustrated in FIG. 1.

As illustrated in FIG. 1 or 2, the conveyance system 100 includes a travel rail 4, vehicles 8 traveling on the travel rail 4, a track R, and overhead transport vehicles V traveling on the track R. The track R is installed in the vicinity of the ceiling of a clean room. The track R is provided across the conveyance system 100 and another conveyance system. Part of the track R is disposed above the travel rail 4. That is, each of the overhead transport vehicles V travels above the travel rail 4. When both of the destination and the source of the FOUP 50 are immediately below the track R, the overhead transport vehicle V can convey the FOUP 50 faster than the vehicle 8 traveling on the travel rail 4 does. Therefore, in such a condition, the overhead transport vehicle V is used for conveyance of the FOUP 50 that needs to be conveyed faster than conveyance with the vehicle 8. The track R may be provided at the same height as the travel rail 4 or below the travel rail 4.

The overhead transport vehicle V is an over head transfer (OHT). The overhead transport vehicle V conveys a FOUP 50 to a cell buffer 22 (described below) provided on the travel rail 4 and picks up the FOUP 50 from the cell buffer 22 to convey the FOUP 50 to another conveyance system.

Figure 3:
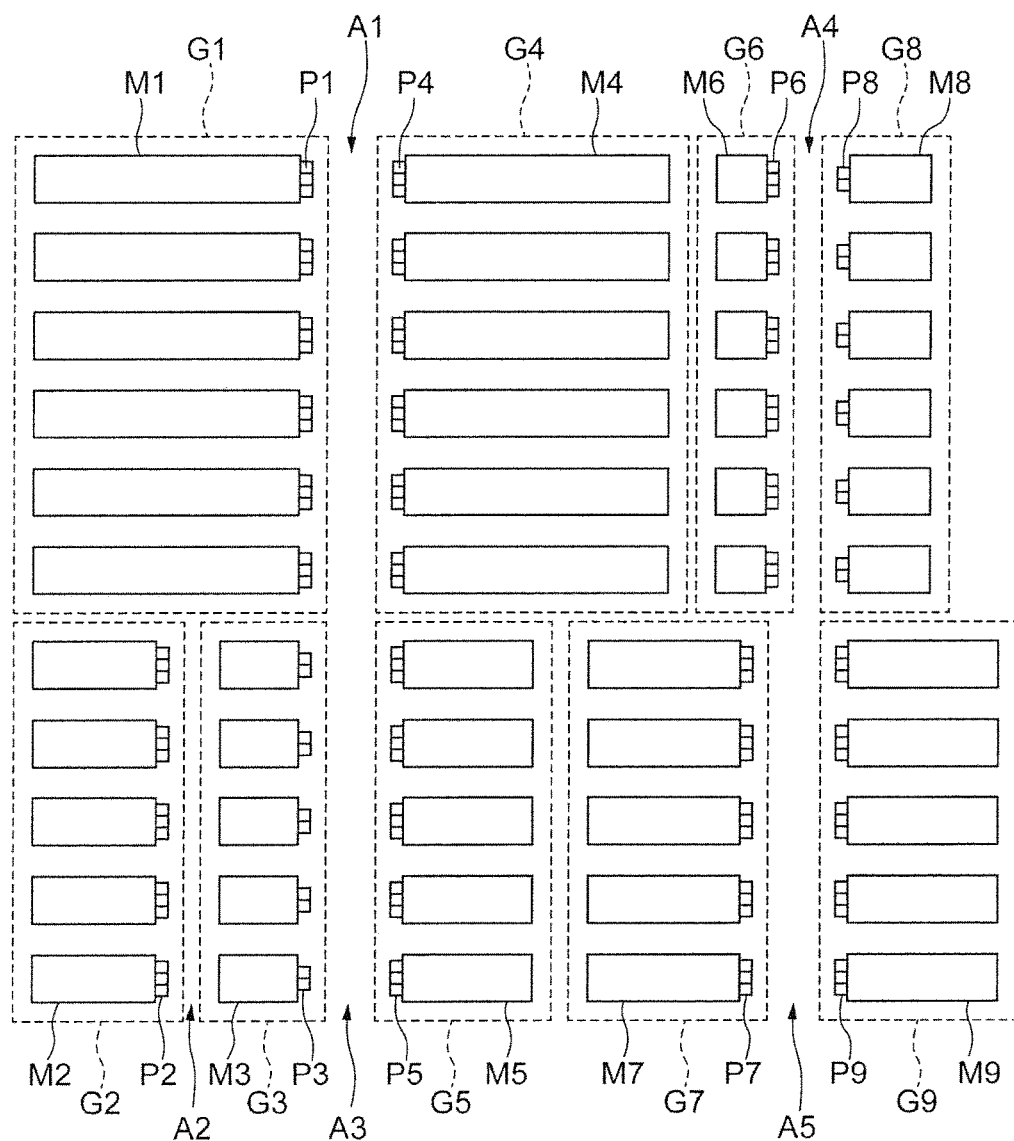
FIG. 3 is a diagram illustrating processing devices provided below a travel rail of the conveyance system illustrated in FIG. 1.

As illustrated in FIG. 1, processing devices are provided below the travel rail 4. Specifically, as illustrated in FIG. 3, provided below the travel rail 4 are a first processing device group G1 having a plurality of first processing devices M1, a second processing device group G2 having a plurality of second processing devices M2, a third processing device group G3 having a plurality of third processing devices M3, a fourth processing device group G4 having a plurality of fourth processing devices M4, a fifth processing device group G5 having a plurality of fifth processing devices M5, a sixth processing device group G6 having a plurality of sixth processing devices M6, a seventh processing device group G7 having a plurality of seventh processing devices M7, an eighth processing device group G8 having a plurality of eighth processing devices M8, and a ninth processing device group G9 having a plurality of ninth processing devices M9. The first processing device group G1 to the ninth processing device group G9 each perform processing in a step (manufacturing process) to manufacture semiconductors. The first processing device group G1 to the ninth processing device group G9 perform, for example, film deposition on a semiconductor wafer and cleaning of a semiconductor wafer. The processing for semiconductor manufacturing is not completed in a single processing device group, and after processing is performed in one processing device group, processing is performed in another processing device group.

The first processing device group G1 and the second processing device group G2 are disposed adjacent to each other in the Y direction. The first processing device group G1 and the third processing device group G3 are disposed adjacent to each other in the Y direction. The first processing device group G1 and the fourth processing device group G4 are disposed adjacent to each other in the X direction. The fourth processing device group G4 and the fifth processing device group G5 are disposed adjacent to each other in the Y direction. The third processing device group G3 and the fifth processing device group G5 are disposed adjacent to each other in the X direction. The fourth processing device group G4 and the seventh processing device group G7 are disposed adjacent to each other in the Y direction. The fourth processing device group G4 and the sixth processing device group G6 are disposed adjacent to each other in the X direction. The sixth processing device group G6 and the seventh processing device group G7 are disposed adjacent to each other in the Y direction. The sixth processing device group G6 and the eighth processing device group G8 are disposed adjacent to each other in the X direction. The eighth processing device group G8 and the ninth processing device group G9 are disposed adjacent to each other in the Y direction. The seventh processing device group G7 and the ninth processing device group G9 are disposed adjacent to each other in the X direction.

The first to ninth processing devices M1 to M9 perform different processing on semiconductor wafers. In other words, the first to ninth processing device groups G1 to G9 perform the processing of respective processes different from each other. The number of the first to ninth processing devices M1 to M9 may be set as appropriate depending on the design.

The first processing device M1 has a first load port (transfer port) (hereinafter simply referred to as "load port") P1, which is an interface for loading and unloading a semiconductor wafer in the FOUP 50 into/from the first processing device M1. The first processing device M1 has, for example, three first load ports P1. The second processing device M2 has a second load port P2. The third processing device M3 has a third load port P3. The fourth processing device M4 has a fourth load port P4. The fifth processing device M5 has a fifth load port P5. The sixth processing device M6 has a sixth load port P6. The seventh processing device M7 has a seventh load port P7. The eighth processing device M8 has an eighth load port P8. The ninth processing device M9 has a ninth load port P9. The number of first to ninth load ports P1 to P9 in the first to ninth processing devices M1 to M9 may be set as appropriate.

In the first processing device group G1, the first processing devices M1 are disposed with predetermined spacing in the Y direction. The first load ports P1 are disposed along the Y direction. Similarly, in the second to ninth processing device groups G2 to G9, the second to ninth processing devices M2 to M9 are disposed with predetermined spacing in the Y direction. The second to ninth load ports P2 to P9 are disposed along the Y direction.

The first processing device M1 in the first processing device group G1 and the fourth processing device M4 in the fourth processing device group G4 are disposed such that the first load port P1 and the fourth load port P4 are opposed to each other. An aisle A1 is provided between the first load port P1 and the fourth load port P4. The aisle A1 has a width, for example, that allows operators to walk through. An aisle A2 is provided between the second processing device group G2 and the third processing device group G3. An aisle A3 is provided between the third processing device group G3 and the fifth processing device group G5. An aisle A4 is provided between the sixth processing device group G6 and the eighth processing device group G8. An aisle A5 is provided between the seventh processing device group G7 and the ninth processing device group G9.

Figure 4:
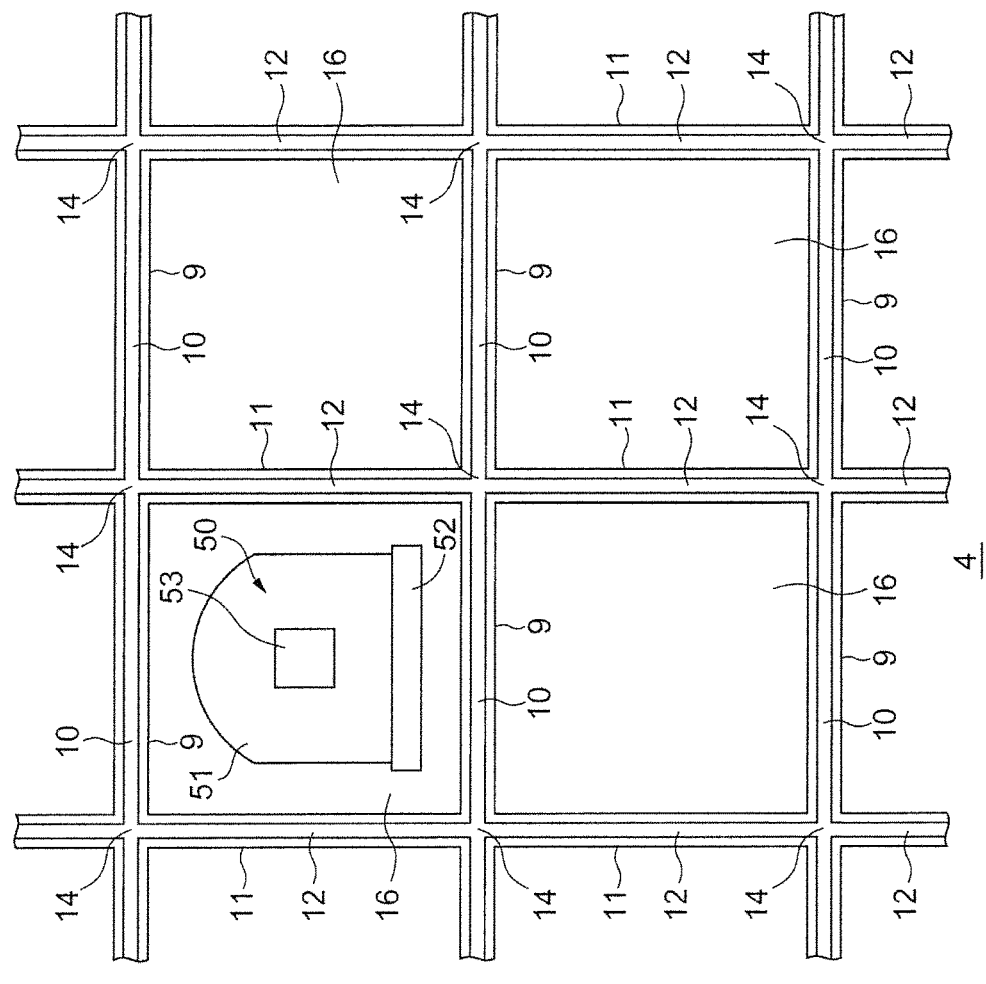
FIG. 4 is a diagram illustrating the travel rail.

As illustrated in FIGS. 1 and 2, the travel rail 4 is provided in a grid pattern in a two-dimensional view. The travel rail 4 is supported, for example, on struts (not illustrated) on the ceiling of the clean room. As illustrated in FIG. 4, the travel rail 4 includes a plurality of first rails 9 and a plurality of second rails 11.

Each of the first rails 9 extends linearly in the X direction (first direction). The first rail 9 is provided with a guide 10. The guide 10 is a groove and provided along the lengthwise direction of the first rail 9. Each of the second rails 11 extends linearly in the Y direction (second direction) orthogonal to the X direction in which the first rail 9 extends. The second rail 11 is provided with a guide 12. The guide 12 is a groove and provided along the lengthwise direction of the second rail 11. A cross point 14 is provided at a section where the guide 10 of the first rail 9 intersects the guide 12 of the second rail 11.

Figure 5:
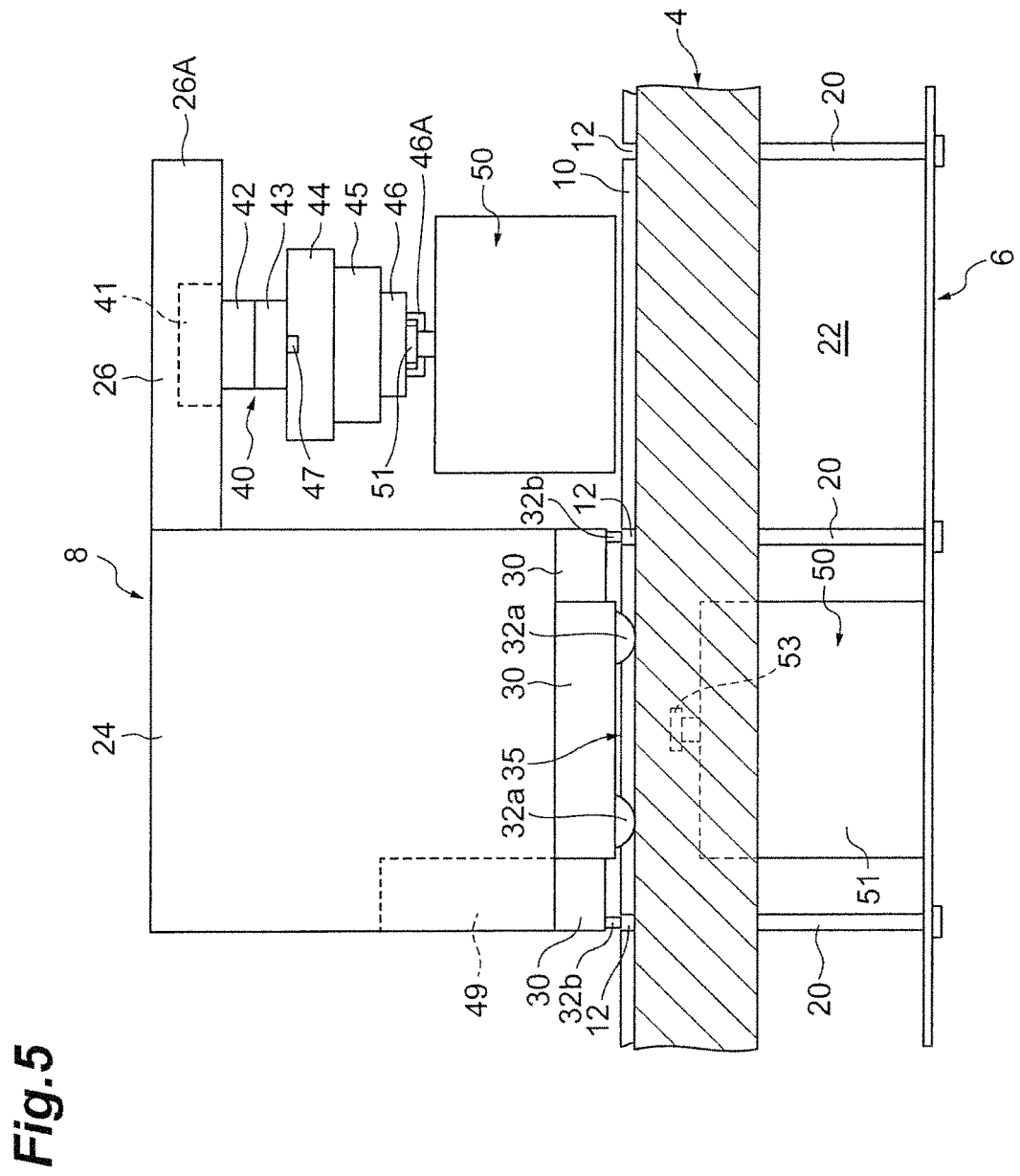
FIG. 5 is a diagram illustrating a vehicle.

As illustrated in FIG. 5, a buffer 6 is provided below the travel rail 4 and above the first to ninth processing devices M1 to M9. The buffer 6 is a shelf in which a FOUP 50 is placed and accommodates a FOUP 50. The buffer 6 is supported by support members 20 on the travel rail 4. The buffer 6 includes a plurality of cell buffers (storages) 22. The cell buffer 22 is set for each rectangular cell (space) 16 defined by the first rail 9 and the second rail 11 in the travel rail 4. The cell buffers 22 each stores one FOUP 50. A FOUP 50 is transferred to the cell buffer 22 through the cell 16. That is, a FOUP 50 passes through the cell 16 in the vertical direction and is transferred to the cell buffer 22. As illustrated in FIG. 5, the buffer 6 is provided at a position where part of the FOUP 50 placed on the buffer 6 overlaps the travel rail 4 in a side view.

As illustrated in FIGS. 2 and 5, a vehicle 8 is provided on the travel rail 4. A plurality of vehicles 8 are provided on the travel rail 4. The vehicle 8 includes a travel part 24 and a transfer part 26. The vehicle 8 further includes a control unit controlling operation of the travel part 24 and the transfer part 26 and a communication unit capable of communication with a host controller. The control unit is, for example, an electronic control unit including a central processing unit (CPU), a read only memory (ROM), and a random access memory RAM). The vehicle 8 conveys a FOUP 50 under an instruction from the host controller.

Figure 6:
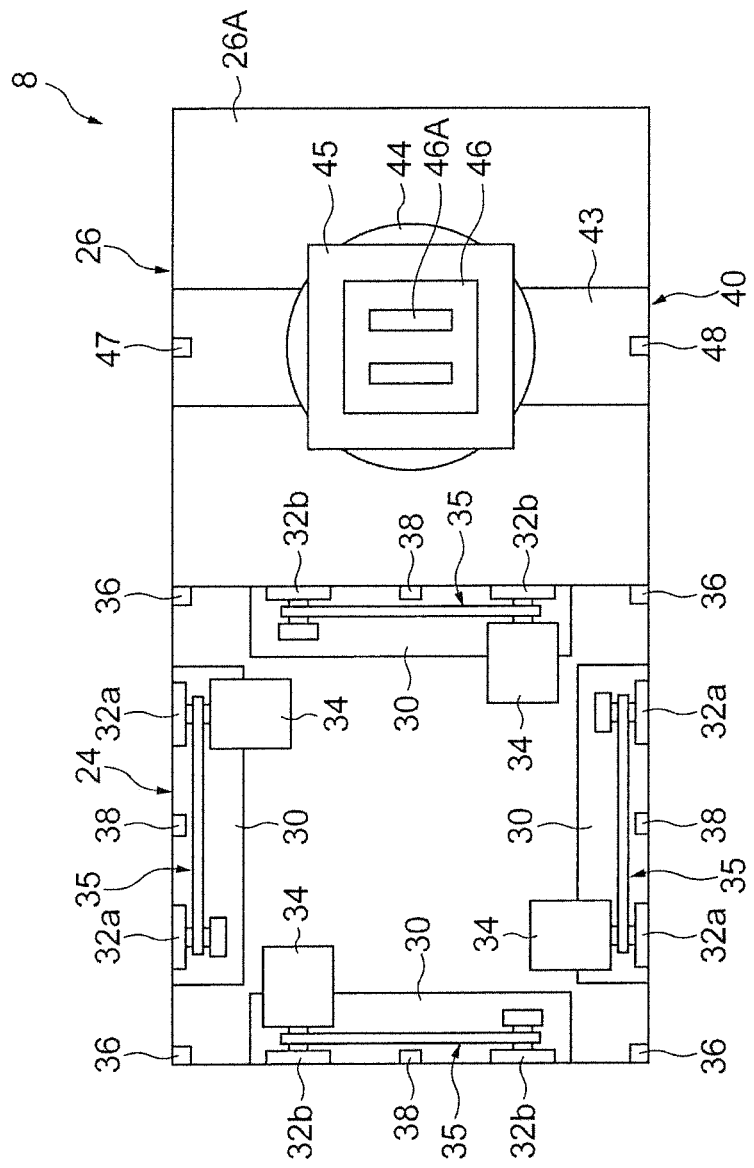
FIG. 6 is a diagram illustrating the vehicle viewed from the bottom side.

The travel part 24 has a rectangular parallelepiped shape. The travel part 24 has a size equivalent to a cell 16 in a two-dimensional view. As illustrated in FIG. 6, the travel part 24 has a plurality of (four in this example) travel units 35. Each travel unit 35 has a plurality of (two in this example) wheels 32a or wheels 32b, a travel motor 34, and an up and down mechanism (switch) 30. Two wheels 32a are provided on each of two sides opposed to each other in the travel part 24. Two wheels 32b are provided on each of two sides orthogonal to the sides having the wheels 32a and opposed to each other in the travel part 24. The wheels 32a are guided in the guide 10 of the first rail 9 and travel on a travel surface of the first rail 9. The wheels 32b are guided in the guide 12 of the second rail 11 and travels on a travel surface of the second rail 11. The travel motor 34 drives the wheels 32a, 32b. The up and down mechanism 30 moves the wheels 32a, 32b and the travel motor 34 upward and downward. The up and down mechanism 30 is, for example, a pantograph or a cam.

With the upward and downward movement of the wheels 32a, 32b by the up and down mechanism 30, the wheels 32a or the wheels 32b come into contact with the guide 10 of the first rail 9 or the guide 12 of the second rail 11 so that the travel part 24 travels along the first rail 9 or the second rail 11. That is, the up and down mechanism 30 moves the wheels 32a or the wheels 32b upward and downward to switch a traveling state between a first traveling state in which the wheels 32a travel along the first rail 9 and a second traveling state in which the wheels 32b travel along the second rail 11.

The travel part 24 has sensors 36 and barcode readers (detector) 38. The sensors 36 are disposed at the four corners on the bottom surface of the travel part 24. The sensor 36 detects the cross point 14 of the travel rail 4. The travel part 24 stops based on the cross point 14 detected by the sensor 36 such that the center of the travel part 24 is located at the center of the cell 16 of the travel rail 4.

Figure 8:
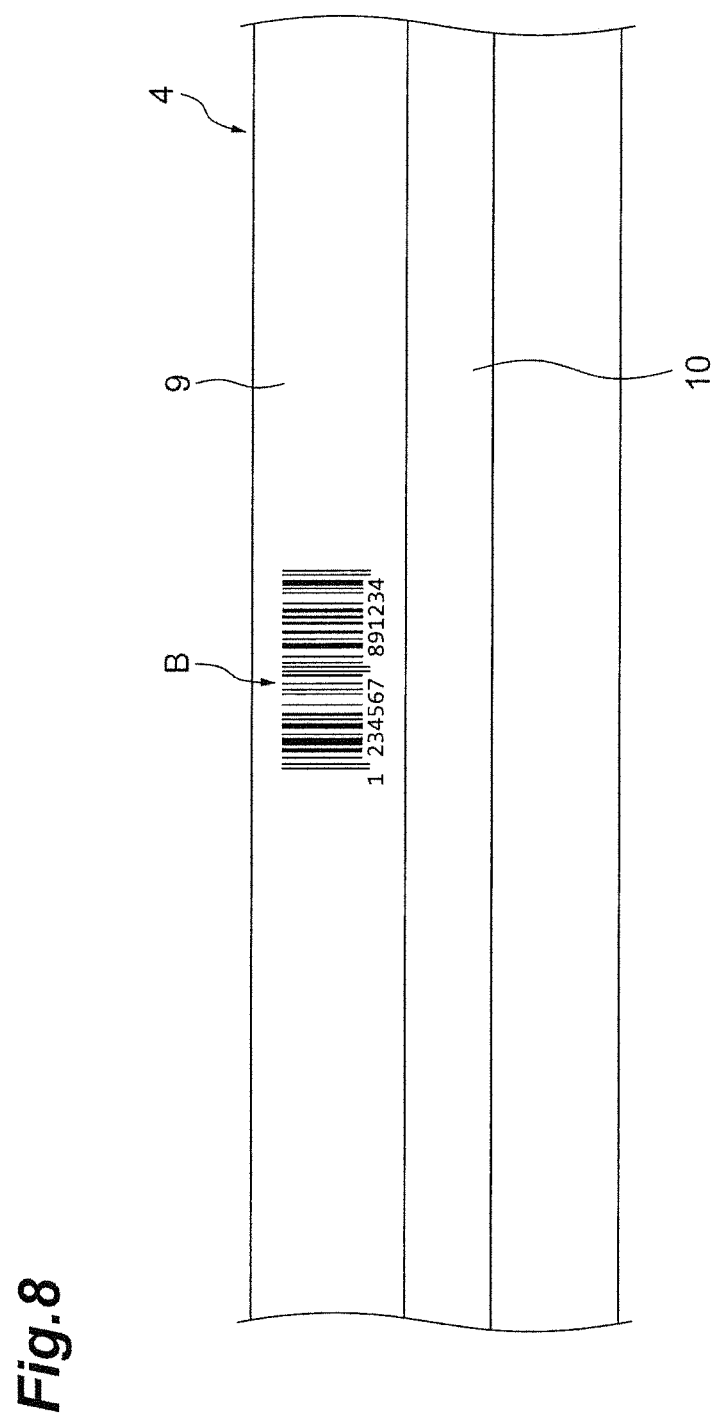
FIG. 8 is a diagram illustrating the travel rail provided with a barcode.

The barcode reader 38 scans a barcode (detection target) B (see FIG. 8). The barcode reader 38 is provided for each travel unit 35 and disposed on the bottom surface of the travel part 24. As illustrated in FIG. 8, the first rail 9 (the second rail 11) is provided with a barcode B. More specifically, the barcode B is disposed at a stop position of the vehicle 8 where the transfer part 26 can be disposed immediately above the first to ninth load ports P1 to P9 of the first to ninth processing devices M1 to M9. The travel part 24 stops at the stop position for the first to ninth load ports P1 to P9, based on the barcode B detected by the barcode reader 38.

The transfer part 26 extends beyond the travel part 24. The transfer part 26 includes a slide fork (movable part) 40, a turning table 44, an elevating device (elevator) 45, an elevating stage 46, and look-down sensors 47 and 48.

Figure 7:
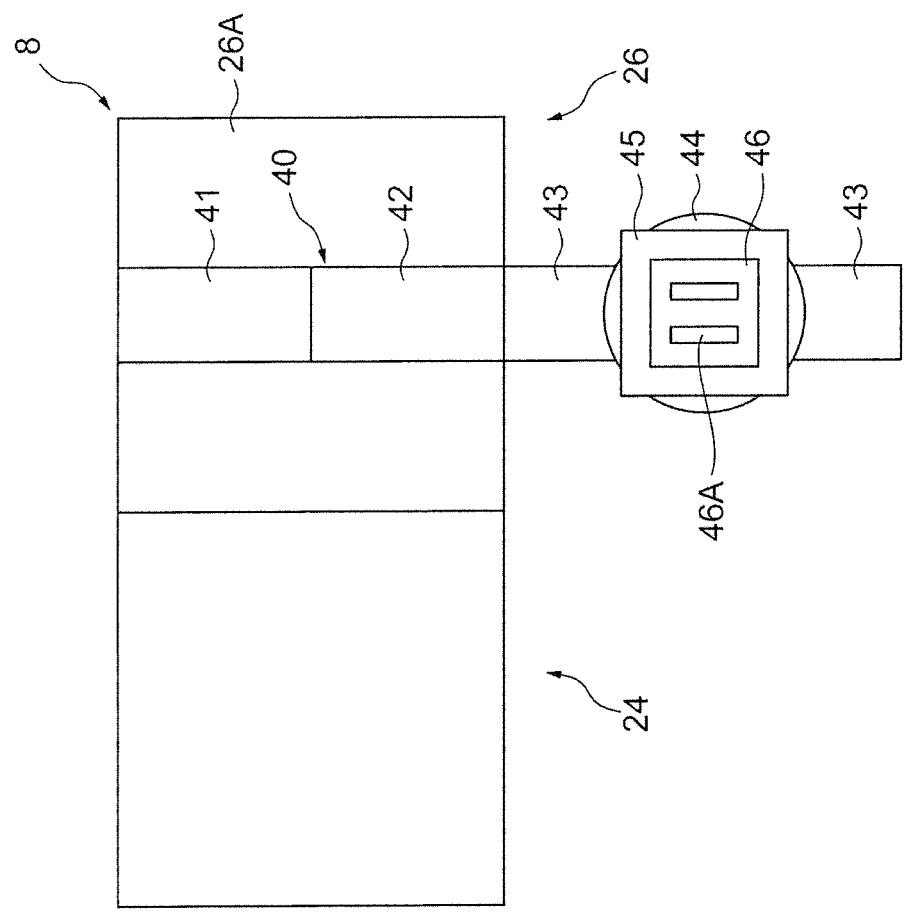
FIG. 7 is a diagram illustrating a transfer part of the vehicle with a slide fork extended.

The slide fork 40 is supported by a support 26A supported on the travel part 24. The slide fork 40 has a base portion 41, a middle portion 42, and a top portion 43. The base portion 41 is provided in the support 26A of the transfer part 26. The slide fork 40 advances and retracts the elevating device 45 in a direction parallel to a plane along the X direction and the Y direction. As illustrated in FIG. 7, the top portion 43 advances on both sides of the transfer part 26, for example, in a stroke equivalent to one side of the cell 16, relative to the base portion 41.

The turning table 44 is provided under the top portion 43. The turning table 44 rotates the elevating device 45 provided under the turning table 44. The turning table 44 is provided to be rotatable, for example, by 180°. The elevating device 45 elevates and lowers the elevating stage 46 through a belt, a rope, a wire and the like. The elevating stage 46 has a gripper (holder) 46A for holding (gripping) the flange 53 of the FOUP 50.

The look-down sensors 47 and 48 detect an object around the elevating stage 46 when the elevating stage 46 is elevated or lowered. The look-down sensors 47 and 48 are disposed at positions in the top portion 43 such that the elevating device 45 is sandwiched therebetween, as illustrated in FIG. 6. Specifically, the look-down sensors 47 and 48 are disposed at positions where the FOUP 50 does not obstruct detection of an object in a state in which the FOUP 50 is held on the elevating stage 46. The transfer part 26 may further include a sensor for detecting the presence/absence of a FOUP 50 in the cell buffer 22 and an ID reader for scanning, for example, the ID provided on a FOUP 50. The transfer part 26 may further include a sensor that detects an object (obstruction) around the vehicle 8 to avoid contact with the overhead transport vehicle V.

The vehicle 8 has a counter weight 49. The counter weight 49 is provided in the travel part 24. The counter weight 49 has the function of cancelling out moment of force applied from the transfer part 26 to the wheels 32. The counter weight 49 keeps the center of gravity of the vehicle 8 in a range surrounded by a plurality of wheels 32.

The travel rail 4 will now be described in more detail. As illustrated in FIG. 1, the travel rail 4 is provided over the first to ninth processing device groups G1 to G9. The travel rail 4 is disposed across a plurality of processing device groups over the entire area in which the first to ninth processing device groups G1 to G9 are disposed. As a specific example, the travel rail 4 in a grid pattern is provided, for example, across between the first processing device group G1 and the fourth processing device group G4. That is, the travel rail 4 is provided also over the aisle A1 provided between the first processing device group G1 and the fourth processing device group G4.

Figure 9:
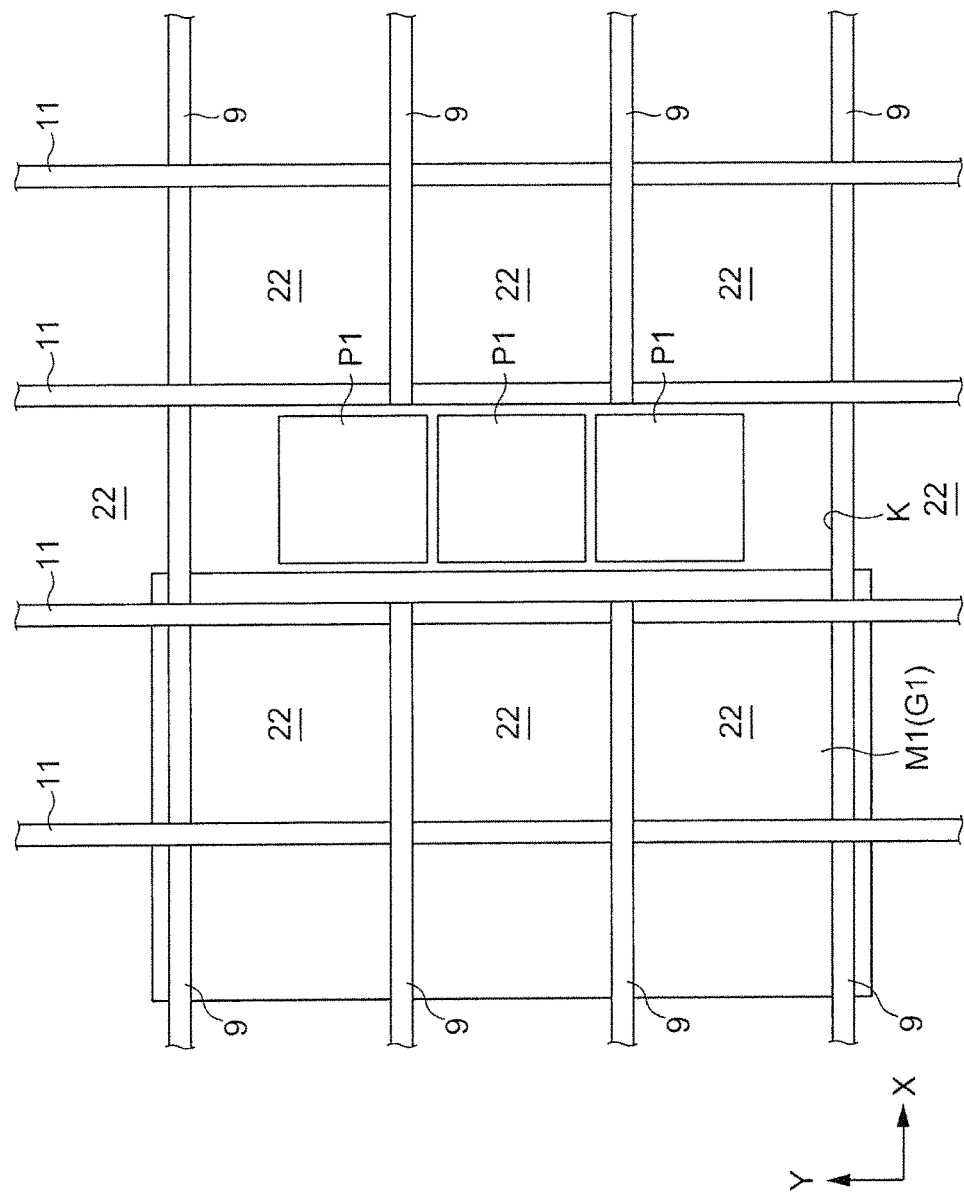
FIG. 9 is a diagram illustrating the travel rail.

As illustrated in FIG. 9, the travel rail 4 is provided with an opening K. In the example illustrated in FIG. 9, the opening K is provided immediately above (vertically above) the first load ports P1 of the first processing device M1. The opening K is a region defined by the first rail 9 and the second rail 11. The opening K makes an opening space above the first load ports P1. In other words, no buffer 6 is provided below the region of the opening K. The opening K is set in a region covering a plurality of (here, three) first load ports P1. The size in the longitudinal direction (the Y direction) of the opening K is larger than the size from one end to the other end of the first load ports P1 in the same direction. The openings K are provided above the first to ninth load ports P1 to P9 of the first to ninth processing devices M1 to M9.

Figure 10:
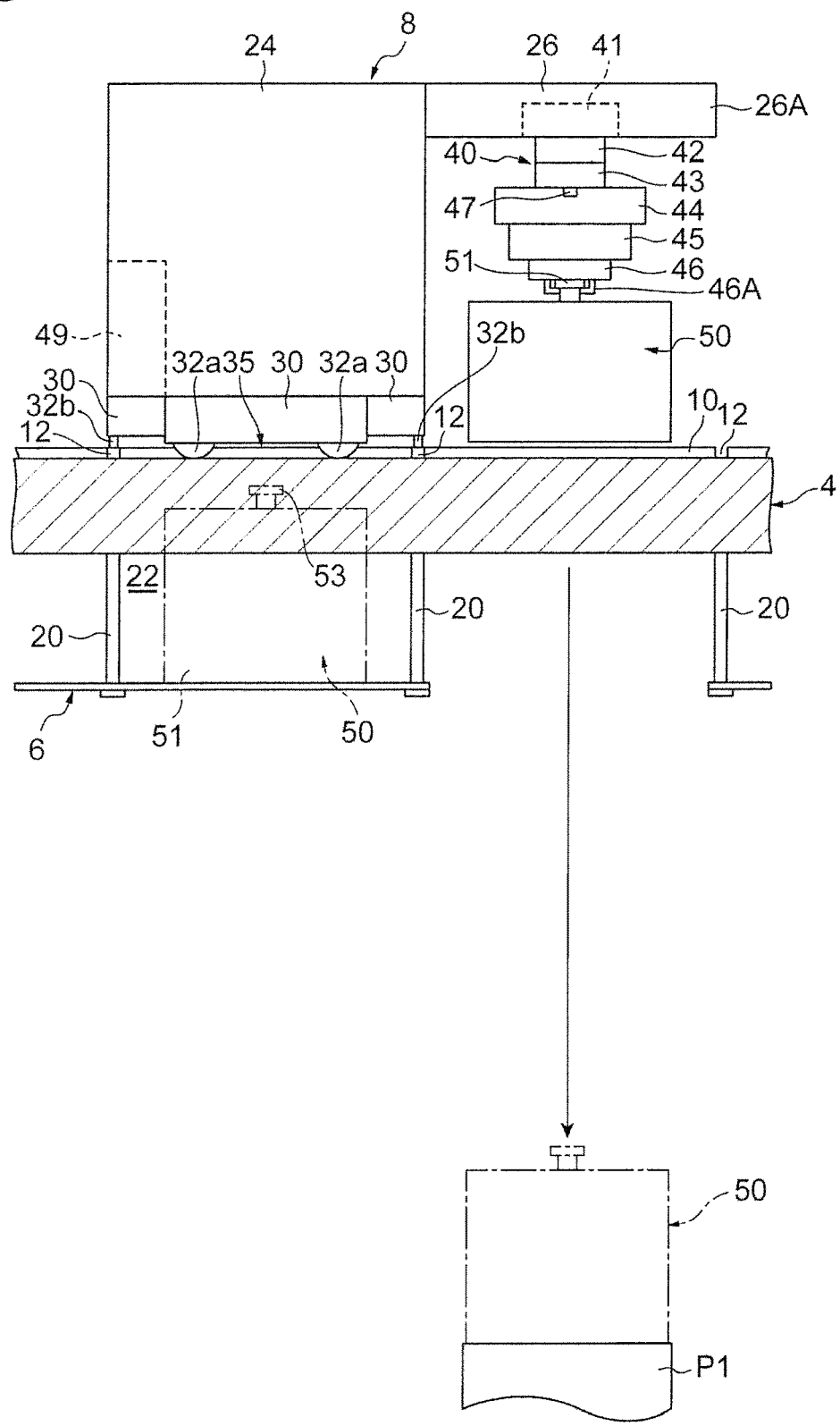
FIG. 10 is a diagram illustrating the vehicle positioned at a stop position where the transfer part is disposed immediately above a load port.

The travel rail 4 is disposed such that the vehicle 8 is accessible to the stop position where the transfer part 26 is disposed immediately above the first to ninth load ports P1 to P9. Specifically, the travel rail 4 is disposed such that the vehicle 8 is accessible to a first stop position in which the transfer part 26 is arranged immediately above each of the load ports of one processing device group performing processing of a certain process (a first processing device group) and such that the vehicle 8 is accessible to a second stop position in which the transfer part 26 is arranged immediately above each of the load ports of another processing device group performing processing of a process different from the certain process (a second processing device group) from the first stop position. As illustrated in FIG. 10, when transferring the FOUP 50 to the first load ports P1, for example, the vehicle 8 stops at a stop position in which the transfer part 26 is positioned immediately above the first load ports P1 and elevates and lowers the elevating stage 46 through the opening K.

Figure 11:
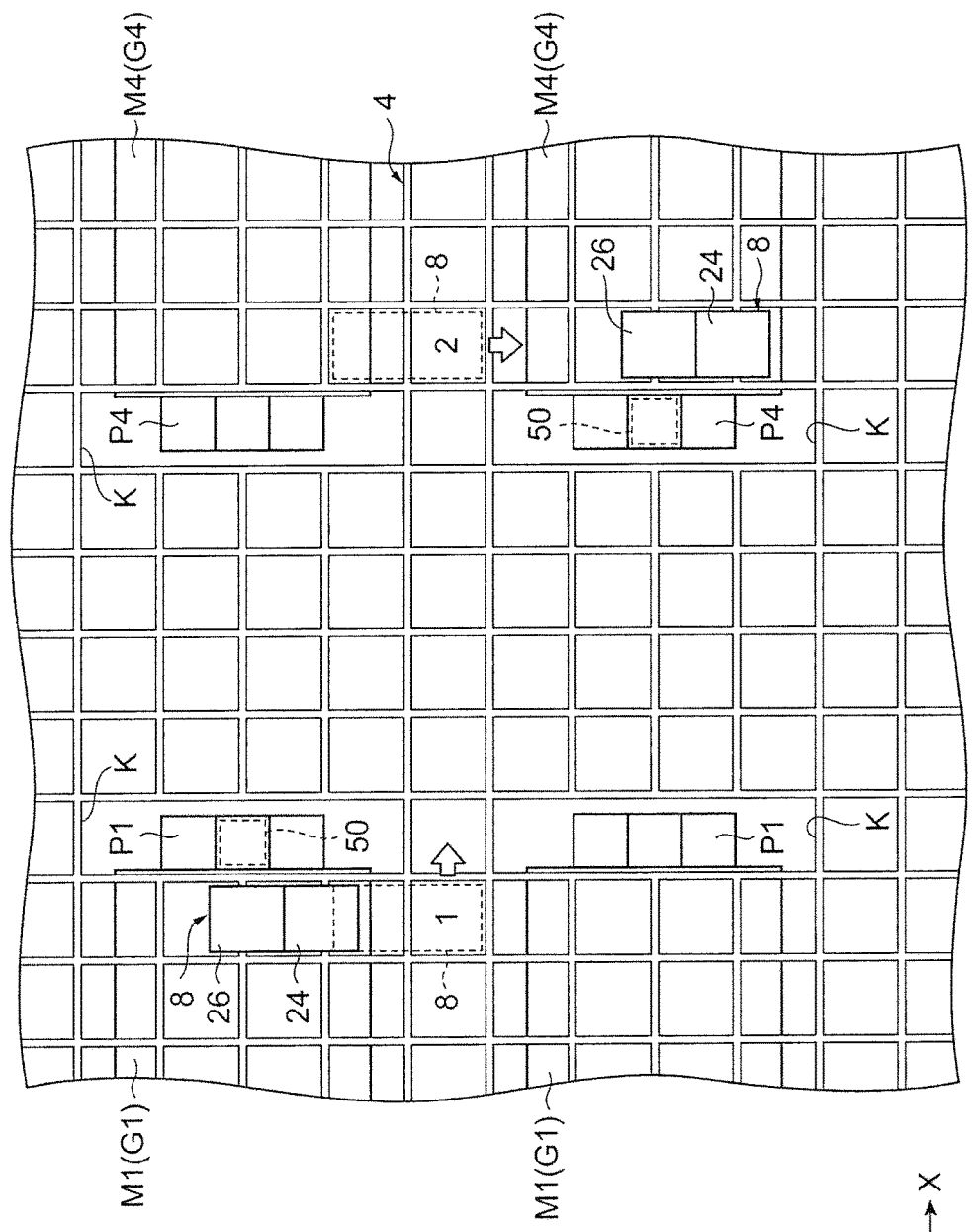
FIG. 11 is a diagram explaining operation of the vehicle.
Figure 12:
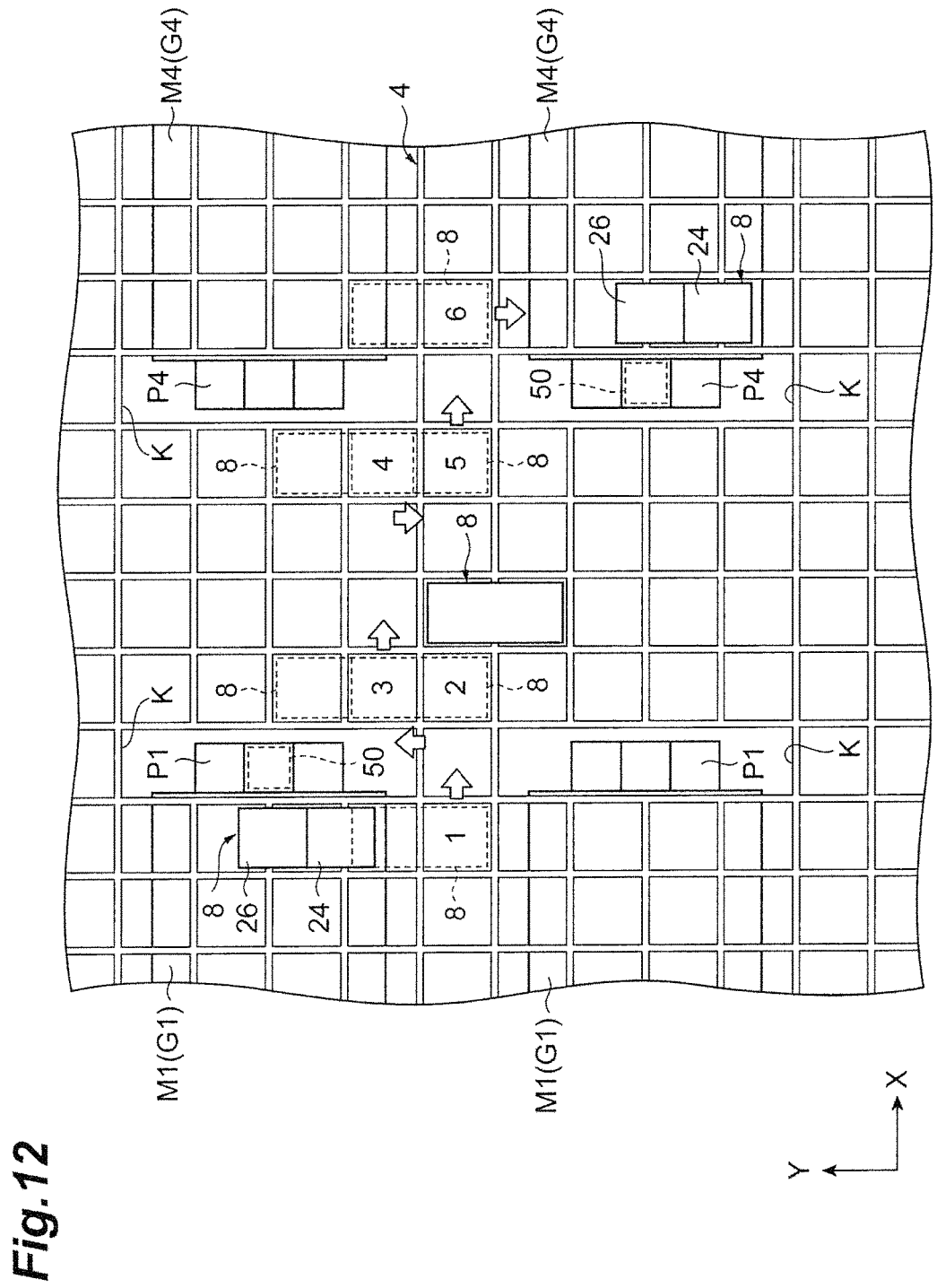
FIG. 12 is a diagram explaining operation of the vehicle.
Figure 13:
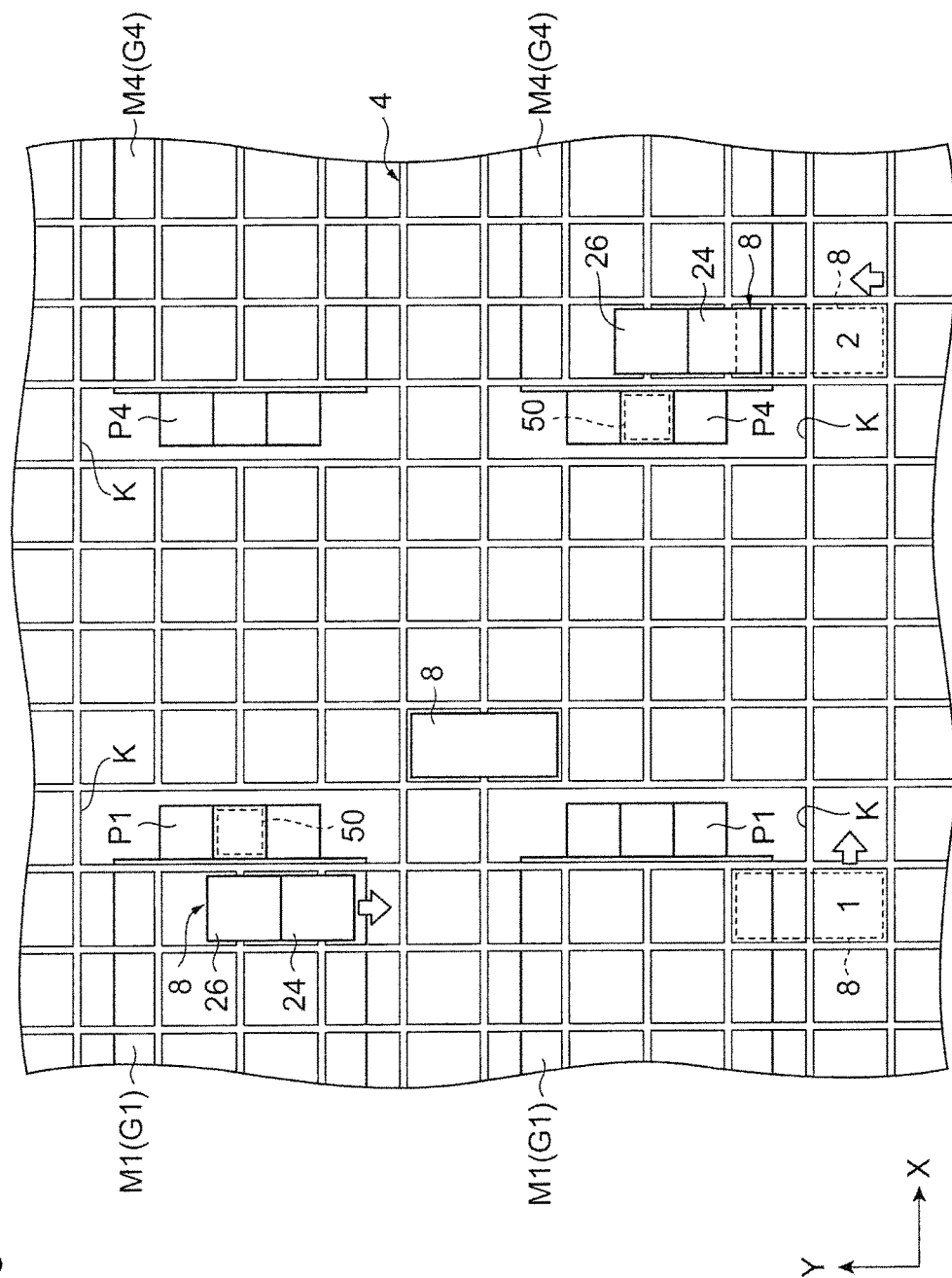
FIG. 13 is a diagram explaining operation of the vehicle.

The following describes operations of the vehicle 8 with reference to FIGS. 11 to 13. In a manner illustrated in FIGS. 11 to 13, the load ports (the first load ports P1 and the fourth load ports P4) are located slightly closer to the second rail 11 with respect to the center in the region of the opening K, and in a state in which the vehicle 8 stops to the left in the figure of the first load ports P1 and stops to the right in the figure of the fourth load ports P4, the slide fork 40 moves the transfer part 26 to immediately above the first load ports P1 and the fourth load ports P4 to transfer the FOUP 50.

First of all, as illustrated in FIG. 11, an example in which the FOUP 50 is conveyed from the first load ports P1 of the first processing devices M1 of the first processing device group G1 to the fourth load ports P4 of the fourth processing devices M4 of the fourth processing device group G4, for example. As illustrated in FIG. 11, the vehicle 8 stops at the first stop position in which the transfer part 26 is arranged immediately above the first load ports P1 to pick up the FOUP 50. Upon picking up the FOUP 50, the vehicle 8 moves to the position denoted by "1" on the lower side in the figure along the Y direction and then moves to the position "2" on the right side in the figure along the X direction. Subsequently, the vehicle 8 moves from the position denoted by "2" to the second stop position in which the transfer part 26 is arranged immediately above the fourth load ports P4, stops there, and transfers the FOUP 50 to the fourth load ports P4. As described above, the vehicle 8 conveys the FOUP 50 through the shortest travel path from the first load ports P1 to the fourth load ports P4.

The following describes a case in which, as illustrated in FIG. 12, when the FOUP 50 is conveyed from the first load ports P1 of the first processing devices M1 of the first processing device group G1 to the fourth load ports P4 of the fourth processing devices M4 of the fourth processing device group G4, for example, another vehicle 8 stops on the travel rail 4 to transfer the FOUP 50 to the cell buffer 22, for example. As illustrated in FIG. 12, the vehicle 8 stops at the first stop position in which the transfer part 26 is arranged immediately above the first load ports P1 to pick up the FOUP 50. Upon picking up the FOUP 50, the vehicle 8 moves to a position denoted by "1" on the lower side in the figure along the Y direction and then moves to a position denoted by "2" on the right side in the figure along the X direction. Next, the vehicle 8 moves to a position denoted by "3" on the upper side in the figure along the Y direction and then moves to a position denoted by "4" on the right side in the figure along the X direction. Next, the vehicle 8 moves to a position denoted by "5" on the lower side in the figure along the Y direction and then moves to a position denoted by "6" on the right side in the figure along the X direction. The vehicle 8 then moves from the position denoted by "6" to the second stop position in which the transfer part 26 is arranged immediately above the fourth load ports P4, stops there, and transfers the FOUP 50 to the fourth load ports P4.

The following describes a case in which, as illustrated in FIG. 13, when the FOUP 50 is conveyed from the first load ports P1 of the first processing devices M1 of the first processing device group G1 to the fourth load ports P4 of the fourth processing devices M4 of the fourth processing device group G4, for example, another vehicle 8 stops on the travel rail 4. As illustrated in FIG. 13, the vehicle 8 stops at the first stop position in which the transfer part 26 is arranged immediately above the first load ports P1 to pick up the FOUP 50. Upon picking up the FOUP 50, the vehicle 8, passing above the first processing devices M1, moves to a position denoted by "1" on the lower side in the figure along the Y direction and then moves to a position denoted by "2" on the right side in the figure along the X direction. Subsequently, the vehicle 8 moves from the position denoted by "2" to the second stop position in which the transfer part 26 is arranged immediately above the fourth load ports P4, stops there, and transfers the FOUP 50 to the fourth load ports P4.

As described above, in the conveyance system 100, the travel rail 4 is disposed such that the vehicle 8 is accessible to the stop position in which the transfer part 26 is arranged immediately above each of the transfer ports of the first processing device group performing the processing of the certain process and such that the vehicle 8 is accessible to the stop position in which the transfer part 26 is arranged immediately above each of the transfer ports of the second processing device group performing the processing of the process different from the certain process. With this configuration, the conveyance system 100, when conveying the FOUP 50 by the vehicle 8 between the transfer port of the first processing device group and the transfer port of the second processing device group, can take a plurality of travel paths by a combination of the X direction and the Y direction and can thus select a travel path to overtake another vehicle 8 in the travel direction ahead stopping to perform a transfer operation and convey the carrier. Consequently, the conveyance system 100 can improve the inter-process conveyance efficiency of the FOUP 50.

In the conveyance system 100, the first to ninth processing device groups G1 to G9 include the first to ninth processing devices M1 to M9, respectively, performing processing different from each other. With this configuration, the conveyance system 100, when the vehicle 8 conveys the FOUP 50 between processing devices of different types, can take a plurality of travel paths by a combination of the X direction and the Y direction and can thus convey the FOUP 50 by selecting a travel path to overtake another vehicle 8 in the travel direction ahead stopping to perform a transfer operation. Consequently, the conveyance system 100 can improve the inter-process conveyance efficiency of the FOUP 50.

In the conveyance system 100, the first to ninth load ports P1 to P9 of the first to ninth processing devices M1 to M9 are arranged adjacent to each other in the Y direction in the first to ninth processing device groups G1 to G9. The travel rail 4 is disposed such that the vehicle 8 capable of entering the first stop position or the second stop position in which the transfer part 26 is arranged immediately above the first to ninth load ports P1 to P9 provided in arrangement directions parallel to each other in the first to ninth processing device groups G1 to G9. With this configuration, the conveyance efficiency of the FOUP 50 among the first to ninth processing device groups G1 to G9 can be improved.

In the conveyance system 100, the vehicle 8 travels on the travel rail with the transfer part 26 positioned above the travel rail 4. The travel rail 4 has an opening K in a region covering each of the first to ninth load ports P1 to P9 in a two-dimensional view. The vehicle 8 transfers the FOUP 50 to the first to ninth load ports P1 to P9 using the transfer part 26 through the opening K. Thus, in the configuration of the vehicle 8 traveling on the travel rail 4 with the transfer part 26 positioned above the travel rail 4, the vehicle 8 can transfer the FOUP 50 to the first to ninth load ports P1 to P9 even when the travel rail 4 is provided to surround the first to ninth load ports P1 to P9 in a two-dimensional view.

The travel rail 4 includes a plurality of first rails 9 and a plurality of second rails 11 that are respectively disposed with spacing to enable the FOUP 50 to pass through in the vertical direction. The cell buffer 22 is provided immediately below the cell 16 defined by the first rail 9 and the second rail 11. The vehicle 8 transfers the FOUP 50 to the cell buffer 22 through the cell 16 using the transfer part 26. In this configuration, in the configuration of the vehicle 8 traveling on the travel rail 4 with the transfer part 26 positioned above the travel rail 4, many FOUPs 50 can be stored at a position that does not obstructs traveling of the vehicle 8.

The cell buffers 22 are provided above the first to ninth load ports P1 to P9. This configuration can reduce the time taken for the vehicle 8 to transfer the FOUP 50 in the cell buffer 22. As a result, the efficiency of conveying the FOUP 50 can be further improved. In addition, the amount of storage of the FOUP 50 can be increased without exclusively using space on the floor in the conveyance system 100.

The first to ninth load ports P1 to P9 are provided at the first to ninth processing devices M1 to M9, and the opening K includes a region covering a plurality of the first to ninth load ports P1 to P9 provided for the first to ninth processing devices M1 to M9. This configuration ensures the degree of freedom of relative position between the travel rail 4 and the first to ninth load ports P1 to P9 in a two-dimensional view.

The transfer part 26 of the vehicle 8 has the slide fork 40 capable of advancing and retracting the elevating device 45 in a direction parallel to a plane along the X direction and the Y direction. The vehicle 8 stops on at least one of the first rail 9 and the second rail 11 forming the opening K and advances the slide fork 40 to transfer the FOUP 50 to the first to ninth load ports P1 to P9 through the opening K. In this configuration, the region of the opening K can be increased. Accordingly, the degree of freedom of relative position between the travel rail 4 and the first to ninth load ports P1 to P9 in a two-dimensional view can be further ensured.

The travel rail 4 is provided with the barcode B at the stop position of the vehicle 8 for the first to ninth load ports P1 to P9. The vehicle 8 includes the barcode reader 38 for detecting the barcode B. The travel part 24 of the vehicle 8 stops the vehicle 8 at the stop position, based on the result of detection by the barcode reader 38. In this configuration, the vehicle 8 can be stopped accurately at the stop position for the first to ninth load ports P1 to P9.

Although an example of my conveyance system has been described above, this disclosure is not intended to be limited to the foregoing example.

Although the foregoing example includes the track R and the overhead transport vehicle V, the track R and the overhead transport vehicle V may not be included.

Figure 14:
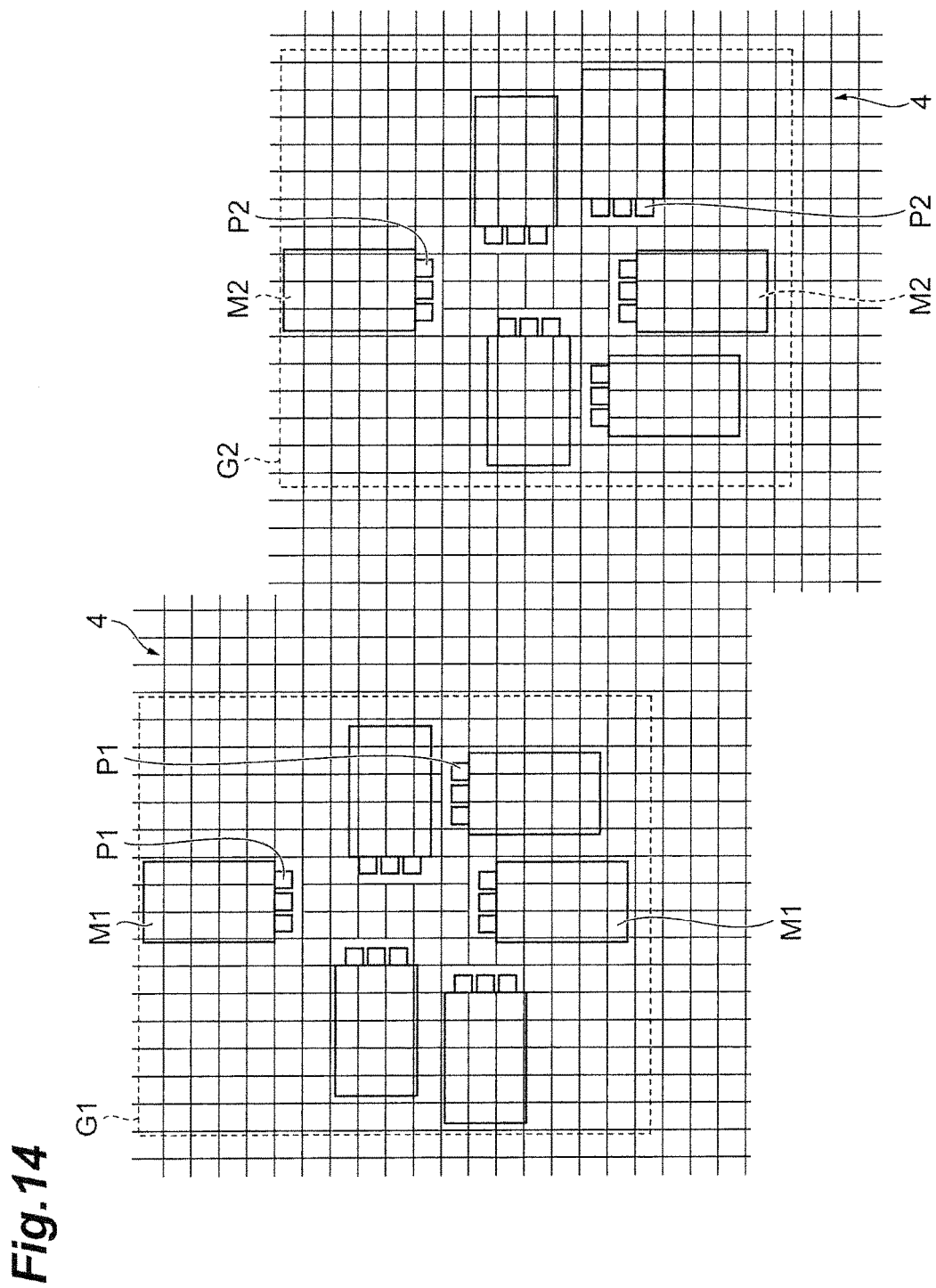
FIG. 14 is a diagram illustrating a travel rail of a conveyance system according to another example.

In the foregoing example, the first to ninth load ports P1 to P9 are disposed along the Y direction. However, the arrangement of the first to ninth load ports P1 to P9 is not limited to this manner. The first to ninth load ports P1 to P9 are set as appropriate depending on the design. For example, as illustrated in FIG. 14 in another example, in the first processing device group G1, the first load ports P1 of the first processing devices M1 are disposed along the Y direction or the X direction. The first load ports P1 and the other first load ports P1 are not arranged on a same straight line but are disposed to be shifted in the Y direction or the X direction. Similarly, in the second processing device group G2, the second load ports P2 of the second processing devices M2 are disposed along the Y direction or the X direction. The second load ports P2 and the other second load ports P2 are not arranged on a same straight line, but are disposed to be shifted in the Y direction or the X direction. Even with this configuration, in the conveyance system 100, the vehicle 8 can take a plurality of paths with a combination of the X direction and the Y direction in the travel rail 4 and therefore can convey the FOUP 50 efficiently between a plurality of load ports provided non-parallel to each other. This configuration can also increase the degree of freedom of arrangement of the first to ninth load ports P1 to P9 and thus the degree of freedom of arrangement of the first to ninth processing devices M1 to M9.

In the foregoing example, the buffer 6 is provided at a position where part of the FOUP 50 placed on the buffer 6 overlaps the travel rail 4 in a side view. However, the buffer 6 (cell buffer 22) may have a placement surface for the FOUP 50 at the same height as the travel rail 4 or above the travel rail 4.

The barcode reader 38 scans the barcode B provided on the travel rail 4. However, the detection target provided on the travel rail 4 may be, for example, a magnetic mark, an optical mark, or a linear scale. Any detector that can detect these detection targets can be employed.

The cell buffer 22 accommodates one FOUP 50. However, the cell buffer 22 may accommodate a plurality of FOUPs 50.

The transfer part 26 of the vehicle 8 has the slide fork 40. However, the slide fork 40 may be replaced by an arm advancing and retracting in the horizontal direction such as a selective compliance assembly robot arm (SCARA).

Figure 15:
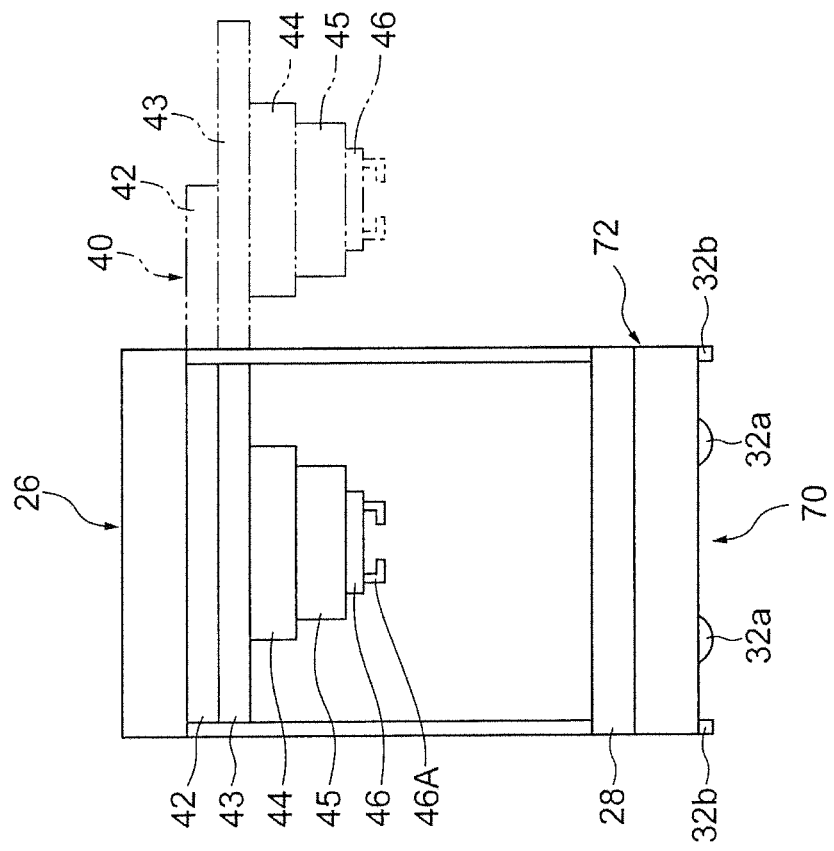
FIG. 15 is a diagram illustrating a vehicle of a conveyance system according to another example.

The vehicle 8 includes the travel part 24 and the transfer part 26, and the transfer part 26 extends beyond the travel part 24. However, the vehicle is not limited to this manner. For example, as illustrated in FIG. 15 in another example, a vehicle 70 has the slide fork 40 in a travel part 72. The vehicle may be configured such that an arm-shaped transfer part rotates about the center of gravity of the travel part. In this configuration, the transfer part may not have a slide fork.

Figure 16:
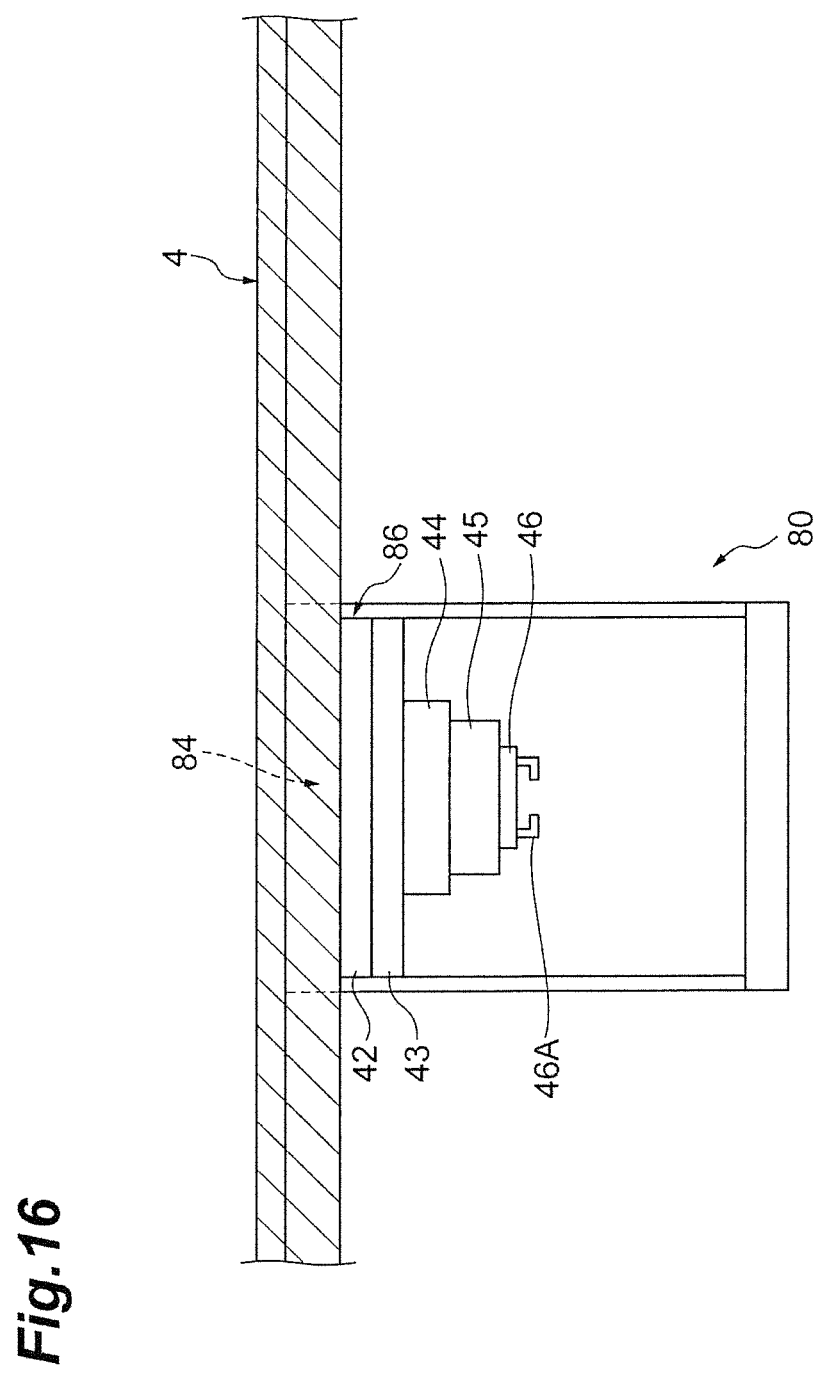
FIG. 16 is a diagram illustrating a vehicle of a conveyance system according to another example.

As illustrated in FIG. 16, a vehicle 80 has a travel part 84 and a transfer part 86. The vehicle 80 may be positioned below the travel rail 4, and the travel part 84 may travel to be suspended from the travel rail 4. In this configuration, the FOUP 50 can be transferred to the first to ninth load ports P1 to P9 without an opening in the travel rail 4. The vehicle may stop immediately above the cell 16 of the travel rail 4 and can transfer the FOUP 50 through the cell 16. That is, the transfer part of the vehicle may not have a slide fork. In this configuration, when the FOUP 50 is transferred to the first to ninth load ports P1 to P9, there is no need for advancing the transfer part, enabling quick transfer of the FOUP 50 to the first to ninth load ports P1 to P9.

In the foregoing example, the travel part 24 of the vehicle 8 includes the up and down mechanism 30. However, the configuration of the switch that switches a traveling state between the first traveling state of traveling along the first rail 9 and the second traveling state of traveling along the second rail 11 is not limited to this manner. A variety of mechanisms can be employed for the switch. For example, the switch may be a mechanism that enables the wheels (travel unit) to move relative to the travel part. In this configuration, the switch allows the wheels to move, whereby the wheels are disposed along the Y direction when the travel part travels along the Y direction whereas the wheels are disposed along the X direction when the travel part travels along the X direction.

Figure 17:
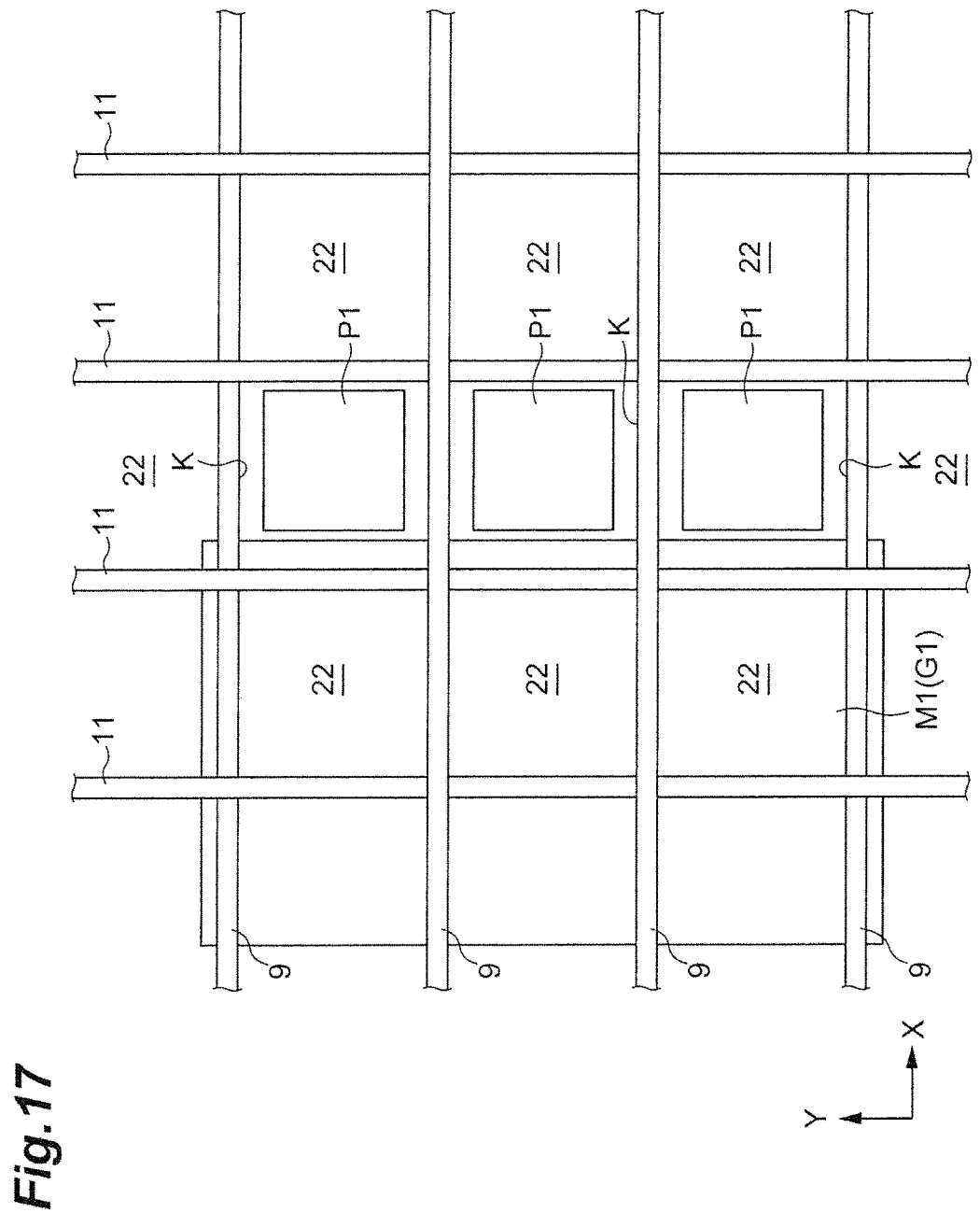
FIG. 17 is a diagram illustrating a travel rail of a conveyance system according to another example.

A plurality of load ports are positioned in the region of the opening K provided in the travel rail 4. However, as illustrated in FIG. 17 in another example, the opening K may be provided to include one first load port P1 in the region. In this configuration, the vehicle 8 may be positioned over the opening K of the travel rail 4 to transfer the FOUP 50 through the opening K. In this configuration, the FOUP 50 can be transferred more quickly to the first to ninth load ports P1 to P9.

Figure 18:
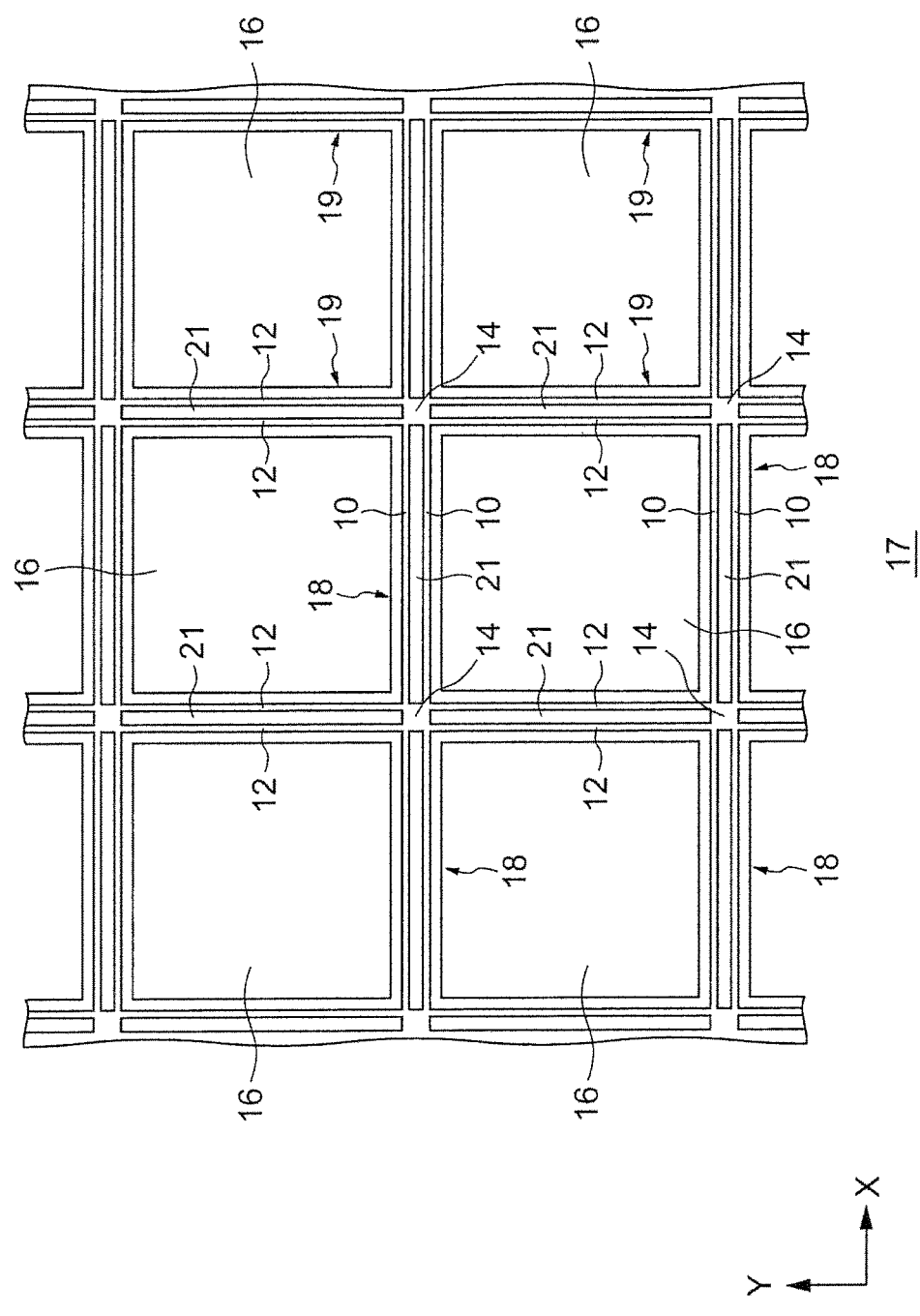
FIG. 18 is a diagram illustrating a travel rail of a conveyance system according to another example.

In the foregoing example, the travel rail 4 is configured with the first rail 9 provided with the guide 10 and the second rail 11 provided with the guide 12. However, the travel rail may be configured, for example, in the manner illustrated in FIG. 18 in another example. As illustrated in FIG. 18, a travel rail 17 is configured with a first rail 18 and a second rail 19. The first rail 18 is provided with two guides 10 and 10. The second rail 19 is provided with two guides 12 and 12. Separators are provided between the guide 10 and the guide 10 and between the guide 12 and the guide 12. The separators 21 have a protruding shape and separate the guide 10 from the guide 10 and from the guide 12 from the guide 12. In the conveyance system including the travel rail 17, two vehicles 8 can be positioned simultaneously on the first rail 18 or on the second rail 19.

The invention claimed is:

1. A conveyance system conveying a carrier that houses a substrate between transfer ports provided respectively to a plurality of processing devices performing processing on the substrate, the conveyance system comprising:
    a travel rail having a plurality of first rails extending linearly in a first direction and a plurality of second rails extending in a second direction orthogonal to the first direction, the first rails and the second rails being disposed in a grid pattern substantially on a same plane and arranged over at least one processing device; and
    a plurality of vehicles adapted to travel into a first or second stop position, each vehicle having a travel part configured to travel on the travel rail in the first direction and the second direction and a transfer part including a holder configured to hold the carrier and an elevator configured to elevate and lower the holder, wherein
    the travel rail is disposed such that each of the vehicles is accessible to the first stop position in which the transfer part is arranged immediately above each of the transfer ports of a first processing device group performing processing of a selected process and such that the vehicle is accessible to the second stop position in which the transfer part is arranged immediately above each of the transfer ports of a second processing device group performing processing of a process different from the selected process from the first stop position,
    the vehicle travels on the travel rail with the transfer part positioned below the travel rail,
    each of the first processing device groups and the second processing device groups has the plurality of transfer ports arranged in the first direction and the plurality of transfer ports arranged in the second direction,
    in each of the first processing device groups and the second processing device groups, the transfer ports arranged in the first direction or the second direction include ones not arranged on a same straight line but disposed at positions shifted in the first direction or the second direction, and
    the travel rail is disposed such that the vehicle is accessible to the first stop position in which the transfer part is arranged immediately above each of the transfer ports of the first processing device group and such that the vehicle is accessible to the second stop position in which the transfer part is arranged immediately above each of the transfer ports of the second processing device group from the first stop position.

2. The conveyance system according to claim 1, wherein the plurality of transfer ports are arranged adjacent to each other in the first direction or the second direction in each of the first processing device group and the second processing device group, and
    the travel rail is disposed such that the vehicle is accessible to the second stop position from the first stop position in which the transfer part is positioned immediately above the transfer ports provided in arrangement directions parallel to each other in the first processing device group and the second processing device group.

3. The conveyance system according to claim 2, wherein the travel rail is disposed such that the vehicle is accessible to the second stop position from the first stop position in which the transfer part is arranged immediately above the transfer ports arranged opposite each other in the first processing device group and the second processing device group.

4. A conveyance system conveying a carrier that houses a substrate between transfer ports provided respectively to a plurality of processing devices performing processing on the substrate, the conveyance system comprising:
    a travel rail having a plurality of first rails extending linearly in a first direction and a plurality of second rails extending in a second direction orthogonal to the first direction, the first rails and the second rails being disposed in a grid pattern substantially on a same plane and arranged over at least one processing device; and
    a plurality of vehicles adapted to travel into a first or second stop position, each vehicle having a travel part configured to travel on the travel rail in the first direction and the second direction and a transfer part including a holder configured to hold the carrier and an elevator configured to elevate and lower the holder, wherein
    the travel rail is disposed such that each of the vehicles is accessible to the first stop position in which the transfer part is arranged immediately above each of the transfer ports of a first processing device group performing processing of a selected process and such that the vehicle is accessible to the second stop position in which the transfer part is arranged immediately above each of the transfer ports of a second processing device group performing processing of a process different from the selected process from the first stop position,
    the vehicle travels on the travel rail with the transfer part positioned below the travel rail,
    the travel rail is provided with a detection target at a stop position of the vehicle for the transfer port,
    the vehicle includes a detector configured to detect the detection target, and
    the travel part stops the vehicle at the stop position, based on a result of detection by the detector.

5. The conveyance system according to claim 4, wherein the plurality of transfer ports are arranged adjacent to each other in the first direction or the second direction in each of the first processing device group and the second processing device group, and
    the travel rail is disposed such that the vehicle is accessible to the second stop position from the first stop position in which the transfer part is positioned immediately above the transfer ports provided in arrangement directions parallel to each other in the first processing device group and the second processing device group.

6. The conveyance system according to claim 5, wherein the travel rail is disposed such that the vehicle is accessible to the second stop position from the first stop position in which the transfer part is arranged immediately above the transfer ports arranged opposite each other in the first processing device group and the second processing device group.

7. The conveyance system according to claim 5, wherein the plurality of first processing device groups and the plurality of second processing device groups provided such that the transfer ports are provided in arrangement directions parallel to each other, and the travel rail is disposed such that the vehicle is accessible to the first stop position in which the transfer part is arranged immediately above the transfer ports of one of the first processing device groups and the second processing device groups and such that the vehicle is accessible to the second stop position in which the transfer part is arranged immediately above the transfer ports of another of the first processing device groups and the second processing device groups from the first stop position.

* * * * *